United States Patent
Gupta et al.

(10) Patent No.: US 11,757,166 B2
(45) Date of Patent: Sep. 12, 2023

(54) SURFACE-MOUNT WAVEGUIDE FOR VERTICAL TRANSITIONS OF A PRINTED CIRCUIT BOARD

(71) Applicant: Aptiv Technologies Limited, St. Michael (BB)

(72) Inventors: Biswadeep Das Gupta, Noblesville, IN (US); Sara J. Cavazos, Kokomo, IN (US); Kurt E. Gilbertson, Peru, IN (US)

(73) Assignee: Aptiv Technologies Limited, St. Michael (BB)

( * ) Notice: Subject to any disclaimer, the term of this patent is extended or adjusted under 35 U.S.C. 154(b) by 339 days.

(21) Appl. No.: 17/155,949

(22) Filed: Jan. 22, 2021

(65) Prior Publication Data
US 2022/0151074 A1    May 12, 2022

Related U.S. Application Data

(60) Provisional application No. 63/112,013, filed on Nov. 10, 2020.

(51) Int. Cl.
*H01P 5/107* (2006.01)
*H01Q 1/22* (2006.01)
(Continued)

(52) U.S. Cl.
CPC .......... *H01P 5/107* (2013.01); *H01Q 1/2283* (2013.01); *H01Q 1/3233* (2013.01); *H05K 1/181* (2013.01);
(Continued)

(58) Field of Classification Search
CPC .... H01Q 1/2283; H01Q 1/3233; H05K 1/181; H05K 2201/037; H05K 2201/09985; H05K 2201/10098; H01P 5/087; H01P 5/107
See application file for complete search history.

(56) References Cited

U.S. PATENT DOCUMENTS 2,840,818 A    6/1958   Reed et al.
3,462,713 A    8/1969   Knerr
(Continued)

FOREIGN PATENT DOCUMENTS

CA    2654470    12/2007
CN    1620738    5/2005
(Continued)

OTHER PUBLICATIONS

"Extended European Search Report", EP Application No. 21203201.5, dated Apr. 7, 2022, 12 pages.
(Continued)

*Primary Examiner* — Robert Karacsony
(74) *Attorney, Agent, or Firm* — Sawtooth Patent Group PLLC

(57) ABSTRACT

Waveguide assemblies are described that utilize a surface-mount waveguide for vertical transitions of a printed circuit board (PCB). The surface-mount waveguide enables low transmission-loss (e.g., increased return-loss bandwidth) by utilizing a waveguide cavity positioned over a plated slot to efficiently transfer electromagnetic energy from one side of the PCB to another side. The waveguide cavity is designed to excite two resonant peaks of the EM energy to reduce a return-loss of power and increase power delivered to an antenna while supporting a high bandwidth of EM energy. Furthermore, the surface-mount waveguide does not require precise fabrication often required for vertical transitions, allowing the surface-mount waveguide to be compatible with low-cost PCB materials (e.g., hybrid PCB stack-ups).

20 Claims, 11 Drawing Sheets

(51) Int. Cl.
*H05K 1/18* (2006.01)
*H01Q 1/32* (2006.01)
(52) U.S. Cl.
CPC .......... H05K 2201/037 (2013.01); H05K 2201/09985 (2020.08); H05K 2201/10098 (2013.01)

(56) References Cited

U.S. PATENT DOCUMENTS

| | | |
|---|---|---|
| 3,579,149 A | 5/1971 | Ramsey |
| 4,157,516 A | 6/1979 | Van De Grijp |
| 4,453,142 A | 6/1984 | Murphy |
| 4,562,416 A | 12/1985 | Sedivec |
| 5,065,123 A | 11/1991 | Heckaman et al. |
| 5,350,499 A | 9/1994 | Shibaike et al. |
| 5,414,394 A | 5/1995 | Gamand et al. |
| 5,637,521 A | 6/1997 | Rhodes et al. |
| 5,923,225 A | 7/1999 | Santos |
| 5,929,728 A | 7/1999 | Barnett et al. |
| 5,982,250 A | 11/1999 | Hung et al. |
| 5,982,256 A | 11/1999 | Uchimura et al. |
| 5,986,527 A | 11/1999 | Ishikawa et al. |
| 6,064,350 A | 5/2000 | Uchimura et al. |
| 6,072,375 A | 6/2000 | Adkins et al. |
| 6,127,901 A | 10/2000 | Lynch |
| 6,414,573 B1 | 7/2002 | Swineford et al. |
| 6,489,855 B1 | 12/2002 | Kitamori et al. |
| 6,535,083 B1 | 3/2003 | Hageman et al. |
| 6,622,370 B1 | 9/2003 | Sherman et al. |
| 6,658,233 B1 | 12/2003 | Ikeda |
| 6,788,918 B2 | 9/2004 | Saitoh et al. |
| 6,794,950 B2 | 9/2004 | Du Tolt et al. |
| 6,859,114 B2 | 2/2005 | Eleftheriades et al. |
| 6,867,660 B2 | 3/2005 | Kitamori et al. |
| 6,958,662 B1 | 10/2005 | Salmela et al. |
| 6,995,726 B1 | 2/2006 | West et al. |
| 7,142,165 B2 | 11/2006 | Sanchez et al. |
| 7,276,988 B2 | 10/2007 | Stoneham |
| 7,420,442 B1 | 9/2008 | Forman |
| 7,439,822 B2 | 10/2008 | Shimura et al. |
| 7,495,532 B2 | 2/2009 | McKinzie, III |
| 7,626,476 B2 | 12/2009 | Kim et al. |
| 7,659,799 B2 | 2/2010 | Jun et al. |
| 7,886,434 B1 | 2/2011 | Forman |
| 7,973,616 B2 | 7/2011 | Shijo et al. |
| 7,994,879 B2 | 8/2011 | Kim et al. |
| 8,013,694 B2 | 9/2011 | Hiramatsu et al. |
| 8,089,327 B2 | 1/2012 | Margomenos et al. |
| 8,159,316 B2 | 4/2012 | Miyazato et al. |
| 8,395,552 B2 | 3/2013 | Geiler et al. |
| 8,451,175 B2 | 5/2013 | Gummalla et al. |
| 8,451,189 B1 | 5/2013 | Fluhler |
| 8,680,936 B2 | 3/2014 | Purden et al. |
| 8,692,731 B2 | 4/2014 | Lee et al. |
| 8,717,124 B2 | 5/2014 | Vanhille et al. |
| 8,803,638 B2 | 8/2014 | Kildal |
| 8,948,562 B2 | 2/2015 | Norris et al. |
| 9,007,269 B2 | 4/2015 | Lee et al. |
| 9,203,155 B2 | 12/2015 | Choi et al. |
| 9,246,204 B1 | 1/2016 | Kabakian |
| 9,258,884 B2 | 2/2016 | Saito |
| 9,356,238 B2 | 5/2016 | Norris et al. |
| 9,450,281 B2 | 9/2016 | Kim |
| 9,647,313 B2 | 5/2017 | Marconi et al. |
| 9,653,773 B2 | 5/2017 | Ferrari et al. |
| 9,673,532 B2 | 6/2017 | Cheng et al. |
| 9,806,393 B2 | 10/2017 | Kildal et al. |
| 9,813,042 B2 | 11/2017 | Xue et al. |
| 9,843,301 B1 | 12/2017 | Rodgers et al. |
| 9,935,065 B2 | 4/2018 | Baheti et al. |
| 9,947,981 B1 | 4/2018 | Strassner et al. |
| 9,991,606 B2 | 6/2018 | Kirino et al. |
| 9,997,842 B2 | 6/2018 | Kirino et al. |
| 10,027,032 B2 | 7/2018 | Kirino et al. |
| 10,042,045 B2 | 8/2018 | Kirino et al. |
| 10,090,600 B2 | 10/2018 | Kirino et al. |
| 10,114,067 B2 | 10/2018 | Lam et al. |
| 10,153,533 B2 | 12/2018 | Kirino |
| 10,158,158 B2 | 12/2018 | Kirino et al. |
| 10,164,318 B2 | 12/2018 | Seok et al. |
| 10,164,344 B2 | 12/2018 | Kirino et al. |
| 10,218,078 B2 | 2/2019 | Kirino et al. |
| 10,230,173 B2 | 3/2019 | Kirino et al. |
| 10,263,310 B2 | 4/2019 | Kildal et al. |
| 10,312,596 B2 | 6/2019 | Gregoire |
| 10,320,083 B2 | 6/2019 | Kirino et al. |
| 10,333,227 B2 | 6/2019 | Kirino et al. |
| 10,374,323 B2 | 8/2019 | Kamo et al. |
| 10,381,317 B2 | 8/2019 | Maaskant et al. |
| 10,381,741 B2 | 8/2019 | Kirino et al. |
| 10,439,298 B2 | 10/2019 | Kirino et al. |
| 10,468,736 B2 | 11/2019 | Mangaiahgari |
| 10,505,282 B2 | 12/2019 | Lilja |
| 10,534,061 B2 | 1/2020 | Vassilev et al. |
| 10,559,889 B2 | 2/2020 | Kirino et al. |
| 10,594,045 B2 | 3/2020 | Kirino et al. |
| 10,601,144 B2 | 3/2020 | Kamo et al. |
| 10,608,345 B2 | 3/2020 | Kirino et al. |
| 10,622,696 B2 | 4/2020 | Kamo et al. |
| 10,627,502 B2 | 4/2020 | Kirino et al. |
| 10,651,138 B2 | 5/2020 | Kirino et al. |
| 10,651,567 B2 | 5/2020 | Kamo et al. |
| 10,658,760 B2 | 5/2020 | Kamo et al. |
| 10,670,810 B2 | 6/2020 | Sakr et al. |
| 10,705,294 B2 | 7/2020 | Guerber et al. |
| 10,707,584 B2 | 7/2020 | Kirino et al. |
| 10,714,802 B2 | 7/2020 | Kirino et al. |
| 10,727,561 B2 | 7/2020 | Kirino et al. |
| 10,727,611 B2 | 7/2020 | Kirino et al. |
| 10,763,590 B2 | 9/2020 | Kirino et al. |
| 10,763,591 B2 | 9/2020 | Kirino et al. |
| 10,775,573 B1 | 9/2020 | Hsu et al. |
| 10,811,373 B2 | 10/2020 | Zaman et al. |
| 10,826,147 B2 | 11/2020 | Sikina et al. |
| 10,833,382 B2 | 11/2020 | Sysouphat |
| 10,833,385 B2 | 11/2020 | Mangaiahgari et al. |
| 10,892,536 B2 | 1/2021 | Fan et al. |
| 10,957,971 B2 | 3/2021 | Doyle et al. |
| 10,957,988 B2 | 3/2021 | Kirino et al. |
| 10,971,824 B2 | 4/2021 | Baumgartner et al. |
| 10,983,194 B1 | 4/2021 | Patel et al. |
| 10,985,434 B2 | 4/2021 | Wagner et al. |
| 10,992,056 B2 | 4/2021 | Kamo et al. |
| 11,061,110 B2 | 7/2021 | Kamo et al. |
| 11,088,432 B2 | 8/2021 | Seok et al. |
| 11,088,464 B2 | 8/2021 | Sato et al. |
| 11,114,733 B2 | 9/2021 | Doyle et al. |
| 11,121,475 B2 | 9/2021 | Yang et al. |
| 11,169,325 B2 | 11/2021 | Guerber et al. |
| 11,171,399 B2 | 11/2021 | Alexanian et al. |
| 11,196,171 B2 | 12/2021 | Doyle et al. |
| 11,201,414 B2 | 12/2021 | Doyle et al. |
| 11,249,011 B2 | 2/2022 | Challener |
| 11,283,162 B2 | 3/2022 | Doyle et al. |
| 11,289,787 B2 | 3/2022 | Yang |
| 11,349,183 B2 | 5/2022 | Rahiminejad et al. |
| 11,349,220 B2 | 5/2022 | Alexanian et al. |
| 11,378,683 B2 | 7/2022 | Alexanian et al. |
| 11,411,292 B2 | 8/2022 | Kirino |
| 11,495,871 B2 | 11/2022 | Vosoogh et al. |
| 11,563,259 B2 | 1/2023 | Alexanian et al. |
| 11,611,138 B2 | 3/2023 | Ogawa et al. |
| 11,626,652 B2 | 4/2023 | Vilenskiy et al. |
| 2002/0021197 A1 | 2/2002 | Elco |
| 2004/0069984 A1 | 4/2004 | Estes et al. |
| 2006/0113598 A1 | 6/2006 | Chen et al. |
| 2006/0145777 A1* | 7/2006 | Mueller ............... H01P 5/107 333/26 |
| 2008/0129409 A1 | 6/2008 | Nagaishi et al. |
| 2008/0150821 A1 | 6/2008 | Koch et al. |
| 2009/0040132 A1 | 2/2009 | Sridhar et al. |
| 2009/0207090 A1 | 8/2009 | Pettus et al. |
| 2009/0243762 A1 | 10/2009 | Chen et al. |
| 2010/0193935 A1 | 8/2010 | Lachner et al. |

(56) References Cited

U.S. PATENT DOCUMENTS

| | | |
|---|---|---|
| 2011/0140810 A1 | 6/2011 | Leiba et al. |
| 2011/0140979 A1 | 6/2011 | Dayan et al. |
| 2012/0013421 A1 | 1/2012 | Hayata |
| 2012/0050125 A1 | 3/2012 | Leiba et al. |
| 2012/0068316 A1 | 3/2012 | Ligander |
| 2012/0163811 A1 | 6/2012 | Doany et al. |
| 2012/0242421 A1 | 9/2012 | Robin et al. |
| 2012/0256707 A1 | 10/2012 | Leiba et al. |
| 2012/0256796 A1 | 10/2012 | Leiba |
| 2013/0057358 A1 | 3/2013 | Anthony et al. |
| 2013/0256849 A1 | 10/2013 | Danny et al. |
| 2014/0015709 A1 | 1/2014 | Shijo et al. |
| 2014/0048310 A1 | 2/2014 | Montevirgen et al. |
| 2014/0091884 A1 | 4/2014 | Flatters |
| 2014/0106684 A1 | 4/2014 | Burns et al. |
| 2015/0097633 A1 | 4/2015 | Devries et al. |
| 2015/0229017 A1 | 8/2015 | Suzuki et al. |
| 2015/0295297 A1 | 10/2015 | Cook et al. |
| 2015/0357698 A1 | 12/2015 | Kushta |
| 2015/0364804 A1 | 12/2015 | Tong et al. |
| 2015/0364830 A1 | 12/2015 | Tong et al. |
| 2016/0043455 A1 | 2/2016 | Seler et al. |
| 2016/0049714 A1 | 2/2016 | Ligander et al. |
| 2016/0056541 A1 | 2/2016 | Tageman et al. |
| 2016/0111764 A1 | 4/2016 | Kim |
| 2016/0118705 A1 | 4/2016 | Tang et al. |
| 2016/0204495 A1 | 7/2016 | Takeda et al. |
| 2016/0276727 A1 | 9/2016 | Dang et al. |
| 2016/0293557 A1 | 10/2016 | Topak et al. |
| 2016/0301125 A1 | 10/2016 | Kim et al. |
| 2017/0084554 A1 | 3/2017 | Dogiamis et al. |
| 2017/0099705 A1 | 4/2017 | Mazzon |
| 2017/0324135 A1 | 11/2017 | Blech et al. |
| 2018/0131084 A1 | 5/2018 | Park et al. |
| 2018/0226709 A1 | 8/2018 | Mangaiahgari |
| 2018/0226727 A1 | 8/2018 | Sato |
| 2018/0233465 A1 | 8/2018 | Spella et al. |
| 2018/0284186 A1 | 10/2018 | Chadha et al. |
| 2018/0343711 A1 | 11/2018 | Wixforth et al. |
| 2018/0351261 A1 | 12/2018 | Kamo et al. |
| 2018/0375185 A1 | 12/2018 | Kirino et al. |
| 2019/0006743 A1 | 1/2019 | Kirino et al. |
| 2019/0013563 A1 | 1/2019 | Takeda et al. |
| 2019/0194452 A1 | 6/2019 | Schrauwen |
| 2019/0207286 A1 | 7/2019 | Moallem |
| 2020/0021001 A1 | 1/2020 | Mangaiahgairi |
| 2020/0153108 A1 | 5/2020 | Uemichi |
| 2020/0235453 A1 | 7/2020 | Lang |
| 2020/0287293 A1 | 9/2020 | Shi et al. |
| 2020/0343612 A1 | 10/2020 | Shi |
| 2020/0412012 A1 | 12/2020 | Zhao et al. |
| 2021/0036393 A1 | 2/2021 | Mangaiahgari |
| 2021/0159577 A1 | 5/2021 | Carlred et al. |
| 2021/0305667 A1 | 9/2021 | Bencivenni |
| 2022/0094071 A1 | 3/2022 | Doyle et al. |
| 2022/0109246 A1 | 4/2022 | Emanuelsson et al. |

FOREIGN PATENT DOCUMENTS

| | | |
|---|---|---|
| CN | 1682404 A | 10/2005 |
| CN | 2796131 | 7/2006 |
| CN | 201383535 | 1/2010 |
| CN | 102696145 A | 9/2012 |
| CN | 103515682 | 1/2014 |
| CN | 104900956 | 9/2015 |
| CN | 105098295 A | 11/2015 |
| CN | 105609909 | 5/2016 |
| CN | 105680133 | 6/2016 |
| CN | 105958167 | 9/2016 |
| CN | 109750201 A | 5/2019 |
| CN | 209389219 | 9/2019 |
| DE | 4241635 A1 | 6/1994 |
| DE | 102016213202 A1 | 1/2018 |
| DE | 102019200893 | 7/2020 |
| EP | 2500978 | 9/2012 |
| EP | 2843758 | 3/2015 |
| EP | 2945222 A1 | 11/2015 |
| EP | 3460903 | 3/2019 |
| GB | 2489950 | 10/2012 |
| JP | 2000357916 A | 12/2000 |
| JP | 2003243902 A | 8/2003 |
| JP | 2003289201 | 10/2003 |
| JP | 3923360 B2 | 5/2007 |
| KR | 20030031585 A | 4/2003 |
| KR | 100846872 | 5/2008 |
| KR | 1020080044752 A | 5/2008 |
| WO | 2013189513 | 12/2013 |
| WO | 2018003932 | 1/2018 |
| WO | 2019085368 A1 | 5/2019 |
| WO | 2021122725 A1 | 6/2021 |

OTHER PUBLICATIONS

Tong, et al., "A Vertical Transition Between Rectangular Waveguide and Coupled Microstrip Lines", IEEE Microwave and Wireless Components Letters, vol. 22, No. 5, May 2012, pp. 251-253.

Topak, et al., "Compact Topside Millimeter-Wave Waveguide-to-Microstrip Transitions", IEEE Microwave and Wireless Components Letters, vol. 23, No. 12, Dec. 2013, pp. 641-643.

"Foreign Office Action", CN Application No. 201810122408.4, dated Jan. 26, 2022, 15 pages.

"Foreign Office Action", CN Application No. 201810122408.4, dated Jan. 30, 2023, 21 pages.

"Foreign Office Action", CN Application No. 201810122408.4, dated May 6, 2022, 15 pages.

"Foreign Office Action", CN Application No. 201810122408.4, dated Sep. 20, 2022, 19 pages.

"Foreign Office Action", CN Application No. 202111321802.9, dated Nov. 22, 2022, 17 pages.

Bauer, et al., "A wideband transition from substrate integrated waveguide to differential microstrip lines in multilayer substrates", Sep. 2010, pp. 811-813.

Dai, et al., "An Integrated Millimeter-Wave Broadband Microstrip-to-Waveguide Vertical Transition Suitable for Multilayer Planar Circuits", IEEE Microwave and Wireless Components Letters, vol. 26, No. 11, 2016, pp. 897-899.

Deslandes, et al., "Integrated Transition of Coplanar to Rectangular Waveguides", 2001 IEEE MTT-S International Microwave Sympsoium Digest, pp. 619-622.

Deutschmann, et al., "A Full W-Band Waveguide-to-Differential Microstrip Transition", Jun. 2019, pp. 335-338.

Giese, et al., "Compact Wideband Single-ended and Differential Microstrip-to-waveguide Transitions at W-band", Jul. 2015, 4 pages.

Rajo-Iglesias, et al., "Gap Waveguide Technology for Millimeter-Wave Antenna Systems", IEEE Communications Magazine, vol. 56, No. 7, Jul. 2018, pp. 14-20.

Tong, et al., "A Wide Band Transition from Waveguide to Differential Microstrip Lines", Dec. 2008, 5 pages.

Yuasa, et al., "A millimeter wave wideband differential line to waveguide transition using short ended slot line", Oct. 2014, pp. 1004-1007.

"Foreign Office Action", CN Application No. 201810122408.4, dated Oct. 18, 2021, 19 pages.

"Non-Final Office Action", U.S. Appl. No. 16/829,409, dated Oct. 14, 2021, 13 pages.

"Non-Final Office Action", U.S. Appl. No. 17/061,675, dated Dec. 20, 2021, 4 pages.

Wang, et al., "Mechanical and Dielectric Strength of Laminated Epoxy Dielectric Graded Materials", Mar. 2020, 15 pages.

"Foreign Office Action", CN Application No. 201810122408.4, dated Jun. 2, 2021, 15 pages.

"Extended European Search Report", EP Application No. 18153137.7, dated Jun. 15, 2018, 8 pages.

"Extended European Search Report", EP Application No. 20166797, dated Sep. 16, 2020, 11 pages.

"Non-Final Office Action", U.S. Appl. No. 16/583,867, dated Feb. 18, 2020, 8 pages.

(56) References Cited

OTHER PUBLICATIONS

"Non-Final Office Action", U.S. Appl. No. 15/427,769, dated Nov. 13, 2018, 8 pages.
"Notice of Allowance", U.S. Appl. No. 15/427,769, dated Jun. 28, 2019, 9 pages.
"Notice of Allowance", U.S. Appl. No. 16/583,867, dated Jul. 8, 2020, 8 Pages.
Jankovic, et al., "Stepped Bend Substrate Integrated Waveguide to Rectangular Waveguide Transitions", Jun. 2016, 2 pages.
"Extended European Search Report", EP Application No. 22159217.3, dated Aug. 19, 2022, 11 pages.
"Extended European Search Report", EP Application No. 22170487.7, dated Sep. 8, 2022, 11 pages.
"Extended European Search Report", EP Application No. 22188348.1, dated Mar. 14, 2023, 8 pages.
"Foreign Office Action", CN Application No. 202111321802.9, dated Mar. 31, 2023, 16 pages.
"Foreign Office Action", EP Application No. 21203201.5, dated Jun. 15, 2023, 11 pages.
Ghahramani, et al., "Reducing Mutual Coupling of SIW Slot Array Antenna Using Uniplanar Compact EBG (UC-EBG) Structure", The 8th European Conference on Antennas and Propagation (EuCAP 2014), Apr. 6, 2014, pp. 2002-2004.
Henawy, et al., "Integrated Antennas in eWLB Packages for 77 GHZ and 79 GHZ Automotive Radar Sensors", 2011 41st European Microwave Conference, Oct. 10, 2011, pp. 1312-1315.
Schellenberg, et al., "CAD Models for Suspended and Inverted Microstrip", IEEE Transactions on Microwave Theory and Techniques, vol. 43, No. 6, Jun. 1995, pp. 1247-1252.

\* cited by examiner

400

```
┌─────────────────────────────────────────────┐
│ A waveguide cavity is formed using a sheet- │
│ metal-drawing process, a sheet-metal-       │
│ stamping process, or a cast heatsink.       │
│                     402                     │
└─────────────────────────────────────────────┘
                      │
                      ▼
┌─────────────────────────────────────────────┐
│ The waveguide cavity is mounted directly    │
│ on the first surface of the PCB and         │
│ positioned over the plated slot             │
│                     404                     │
└─────────────────────────────────────────────┘
                      │
                      ▼
┌─────────────────────────────────────────────┐
│ The waveguide cavity performs impedance     │
│ matching of the EM energy while guiding     │
│ the EM energy from the first surface to the │
│ second surface of the PCB via the plated    │
│ slot                                        │
│                     406                     │
└─────────────────────────────────────────────┘
```

*FIG. 4*

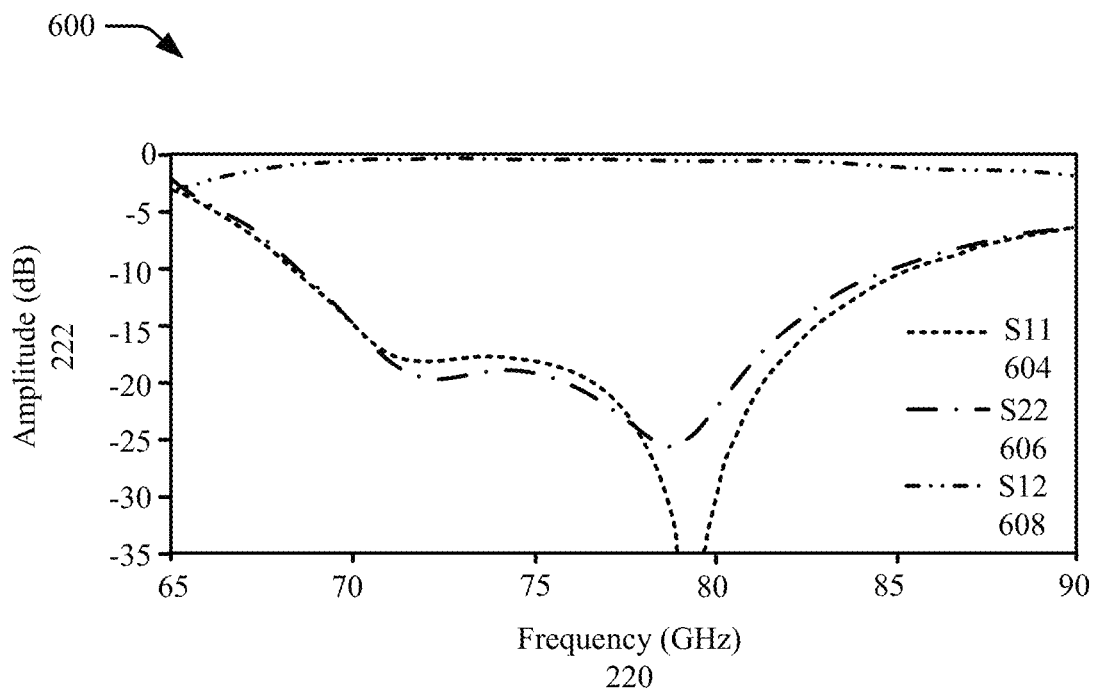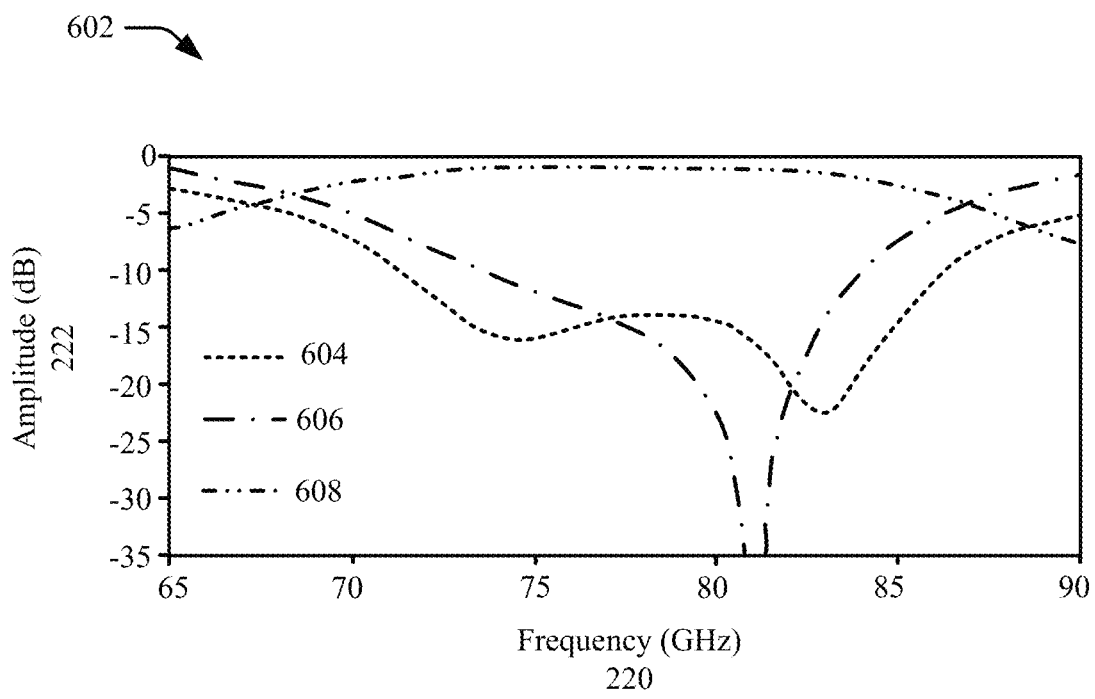
FIG. 6

SURFACE-MOUNT WAVEGUIDE FOR VERTICAL TRANSITIONS OF A PRINTED CIRCUIT BOARD

CROSS-REFERENCE TO RELATED APPLICATION

This application claims the benefit under 35 U.S.C. 119(e) of U.S. Provisional Application No. 63/112,013, filed Nov. 10, 2020, the disclosure of which is hereby incorporated by reference in its entirety herein.

BACKGROUND

A printed circuit board (PCB) may be part of many types of electronic components including automobiles, radar systems, smartphones, computers, and so forth. To achieve a compact design, PCBs utilize vertical transitions to transfer electrical signals (e.g., electromagnetic energy) from one side of the PCB to an antenna or a radio-frequency (RF) structure on another side of the PCB. However, there are many challenges associated with vertical transitions, including high transmission loss, which may reduce power delivered to the antenna or RF structure, thereby limiting operations of the PCB (e.g., limiting radar detection of a nearby object). Fabricating PCBs with vertical transitions requires high accuracy, which can be difficult to achieve without using complex manufacturing techniques involving etching, imaging, and layer alignment. Manufacturing vertical transitions using these techniques can be more expensive than if no vertical transitions are used, including in the PCB materials needed to support the expensive fabrication.

SUMMARY

Waveguide assemblies are described that utilize a surface-mount waveguide for vertical transitions of a printed circuit board (PCB). The surface-mount waveguide enables low transmission-loss (e.g., increased return-loss bandwidth) by utilizing a waveguide cavity positioned over a plated slot to efficiently transfer electromagnetic energy from one side of the PCB to another side. The waveguide cavity is designed to excite two resonant peaks of the EM energy to reduce a return-loss of power and increase power delivered to an antenna while supporting a high bandwidth of EM energy. Furthermore, the surface-mount waveguide does not require precise fabrication often required for vertical transitions, allowing the surface-mount waveguide to be compatible with low-cost PCB materials (e.g., hybrid PCB stack-ups).

Aspects described below include a waveguide assembly that utilizes a surface-mount waveguide for vertical transitions of a printed circuit board (PCB). The PCB includes at least one PCB layer that includes a first surface and a second surface positioned opposite and in parallel with the first surface. The PCB also includes a plated slot configured to channel an electromagnetic (EM) energy from a planar dimension in parallel with the first surface to a vertical dimension that is orthogonal to the planar dimension. The plated slot comprises an opening surrounded by a conductive material to enable electrical connections between the first surface and the second surface. The opening is configured to transfer the EM energy between the first surface and the second surface. The PCB additionally includes a waveguide cavity mounted directly on the first surface and positioned over the plated slot. The waveguide cavity is configured to perform impedance matching of the EM energy while guiding the EM energy from the first surface to the second surface via the plated slot.

BRIEF DESCRIPTION OF DRAWINGS

A surface-mount waveguide for vertical transitions of a printed circuit board is described with reference to the following drawings. The same numbers are used throughout the drawings to reference like features and components:

FIG. 2-1 illustrates a bottom surface of a waveguide cavity configured to generate a first and a second resonant peak of a reflected power illustrated in frequency;

FIG. 2-2 graphically illustrates a reflected power in terms of a frequency;

FIG. 2-3 illustrates the waveguide cavity;

FIG. 3 illustrates a multi-layer printed circuit board (PCB) including an integrated circuit;

FIG. 4 illustrates an example technique for implementing the waveguide cavity;

FIG. 6 illustrates preliminary results of the reflected power of a waveguide assembly using a drawn-waveguide cavity and a stamped-waveguide cavity;

FIG. 7-1 illustrates preliminary results of the reflected power for the drawn-waveguide cavity for displacements along a length axis;

FIG. 7-2 illustrates preliminary results of the reflected power for the drawn-waveguide cavity for displacements along a width axis; and FIG. 7-3 illustrates preliminary results of the reflected power for the drawn-waveguide cavity for angular displacements within a planar dimension.

DETAILED DESCRIPTION

Overview

Figure 1:
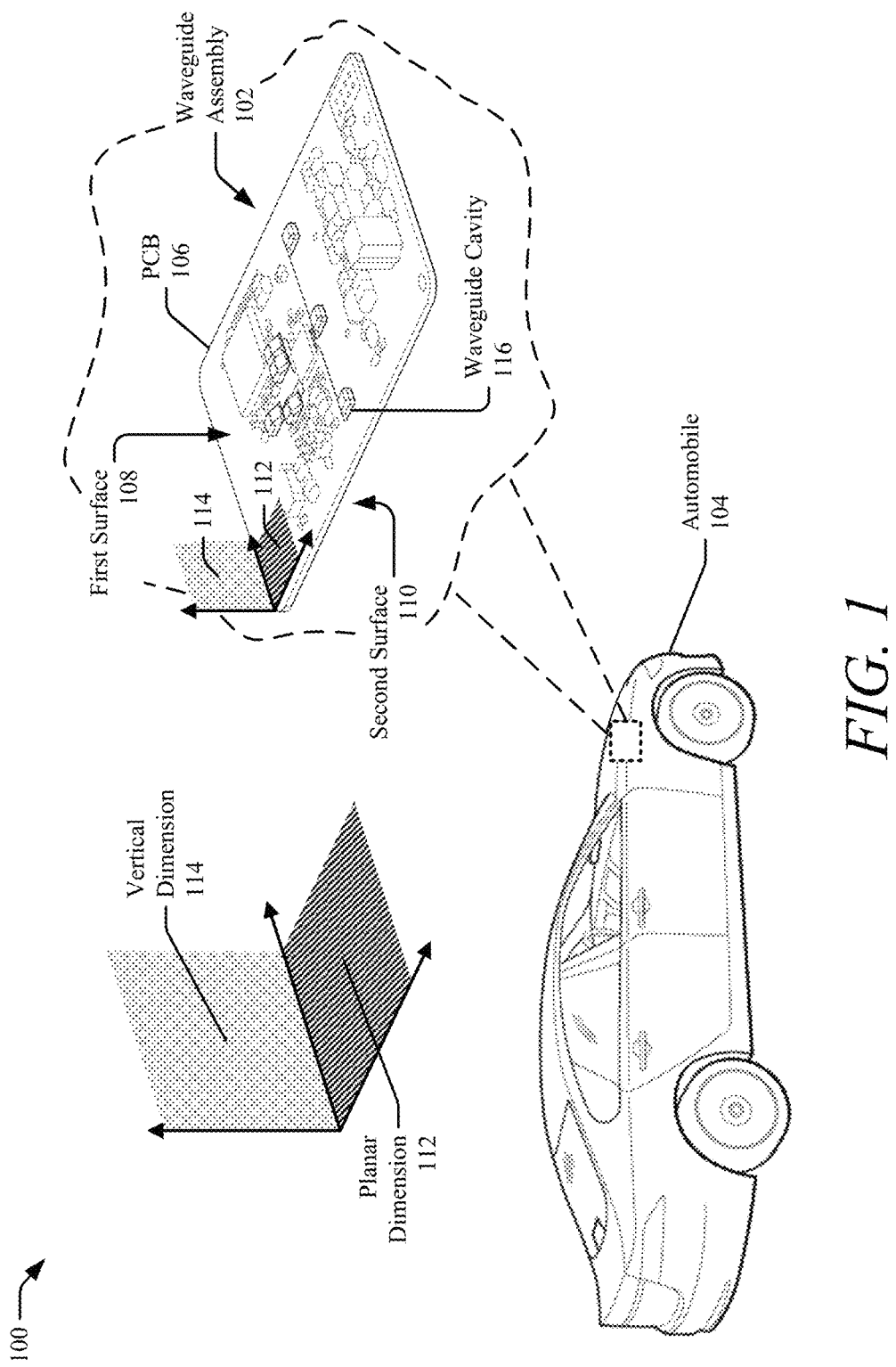
FIG. 1 illustrates an example environment in which a surface-mount waveguide can be implemented.

To achieve a compact design, PCBs can utilize vertical transitions to transfer electrical signals (e.g., electromagnetic (EM) energy) from one side of the PCB to an antenna or a radio-frequency (RF) structure on another side of the PCB. However, there are many challenges associated with vertical transitions and the accuracy of their fabrication, including etching, imaging, and layer alignment, and high transmission-loss that may result. Therefore, vertical transitions may reduce power delivered to the antenna or RF structure, limiting operations of the PCB (e.g., limiting radar detection of a nearby object). Vertical transitions often cannot be fabricated with low-cost PCB materials and instead may need to be formed with high-cost materials and expensive fabrication techniques.

Designing a vertical transition to enable low transmission-loss of the EM energy can be a further challenge. An electronic device may require the vertical transition to transport power associated with the EM energy to the antenna or radio-frequency (RF) structure to perform operations (e.g., radar detection of a nearby object). However, these operations may be inhibited by transmission loss if power supplied to the antenna or RF structure is insufficient. For example, when the EM energy encounters a vertical transition, there may be an impedance mismatch, resulting in reduced or insufficient transfer of power (e.g., transmission loss) to the antenna. Furthermore, operations of PCB components (e.g., transport, storage, or processing of electrical signals by an integrated circuit (IC), transistors, diodes, capacitors, resistors, and so forth) may become inhibited or permanently damaged by transmission loss due in part to heating of the PCB via dissipation of the EM energy.

Regarding challenges associated with vertical transitions that are due to the accuracy of the PCB fabrication, vertical transitions include an opening of the PCB to transport the EM energy from one side of the PCB to another side. For PCBs that include many layers (e.g., substrates), the opening may need to be aligned accurately within each layer. However, the PCB fabrication is prone to errors including etching, imaging, and layer-alignment errors. Therefore, RF materials (e.g., IT-150DA laminates and Rogers high-frequency laminates RO3003 and RO4835) which are more expensive than low-cost materials (e.g., flame retardant 4 (FR-4) composite materials) are required for PCBs with many layers (e.g., hybrid PCB stack-ups) to increase an accuracy of the PCB fabrication. This can result in higher costs to a manufacturer and a consumer.

To mitigate these challenges, some PCBs do not include vertical transitions. Instead, the PCB components may be located on a same side as the antenna or RF structure. For example, the IC may be located next to the antenna, eliminating a need for the vertical transition. However, there are several drawbacks to these PCBs. For example, the IC needs to be shielded to reduce interaction with the antenna. The antenna may need to be reduced in size, which may further reduce a quality of antenna operations. The PCB may need to be larger to allow for mounting of the PCB components on the same side. Furthermore, there can be additional costs associated with this type of PCB if a dual-sided surface-mount technology (SMT) process is required.

To address these challenges, this document describes a waveguide assembly that utilizes a surface-mount waveguide for vertical transitions of the PCB. The waveguide assembly described herein utilizes a waveguide cavity that is mounted directly to the PCB and positioned over a plated slot (e.g., vertical transition) to transport the EM energy from one side of the PCB to the other side. A shape and a size of the waveguide cavity are designed to increase a return-loss bandwidth and reduce transmission loss of the EM energy.

The waveguide assembly described herein can increase power supplied to the antenna or RF structure by utilizing an air medium instead of a dielectric material (e.g., RF materials, FR-4) to transport the EM energy. The air medium will produce a lower return-loss of the power and enable an increase in the return-loss bandwidth of the EM energy. For example, an entry opening of the waveguide cavity may excite a mode (e.g., dominant mode TE10) and set an initial impedance that is matched by tapering the EM energy from the entry opening and choosing an appropriate length of the waveguide cavity. The initial impedance is matched with an impedance associated with a microstrip line (e.g., a line of conductive material that may be used to transport the EM energy within the PCB) by tapering the EM energy with a slanted section of the waveguide cavity. Tapering the EM energy can increase the return-loss bandwidth and also produce a smoother transmission response.

The waveguide assembly described herein can also reduce costs associated with the PCB fabrication. The waveguide cavity reduces a need for precise alignment of the vertical transitions in a multi-layer PCB. As a result, low-cost PCB materials may be integrated into layers of the PCB. For example, a hybrid PCB stack-up may include a top layer that comprises a material that is distinct from materials used in remaining layers. The top layer may include more expensive dielectric materials (e.g., IT-150DA, RO3003, and RO4835), but the remaining layers can include low-cost materials. This can provide low costs to the manufacturer and the consumer.

Example Environment

FIG. 1 illustrates an example environment 100 in which a waveguide assembly 102 is used on an automobile 104. The automobile 104 may use the waveguide assembly 102 to enable operations of a radar system that is configured to determine a proximity, an angle, or a velocity of at least one object. For example, the waveguide assembly 102 may be located on a front of the automobile 104 to detect the presence of nearby objects and avoid collisions. While the example environment 100 depicts an automobile 104, other devices (e.g., desktop computers, tablets, laptops, televisions, computing watches, smartphones, gaming systems, and so forth) may support techniques described herein.

The waveguide assembly 102 includes a PCB 106 with at least one layer. The PCB 106 is designed to mechanically support and electrically connect components (e.g., ICs, transistors, diodes, capacitors, resistors, and so forth) using conductive materials. The PCB 106 includes a first surface 108 and a second surface 110. The second surface 110 is positioned opposite and in parallel with the first surface 108. The first surface 108 is aligned in parallel with a planar dimension 112 and orthogonal to a vertical dimension 114. The vertical dimension 114 connects the first surface 108 and the second surface 110.

The waveguide assembly 102 also includes a waveguide cavity 116 that is mounted directly on the first surface 108. The waveguide cavity 116 may be mounted using, for example, a through-hole technology or a surface-mount technology (SMT). SMT is a process of designing the PCB 106 with flat pads covered in a conductive material (e.g., tin-lead, silver, gold, or copper) to connect components to the first surface 108 using solder, whereas, through-hole technology is a process of connecting components to the PCB 106 by inserting component leads into drilled holes and soldering the leads to pads on the second surface 110.

Figures 1, 2:
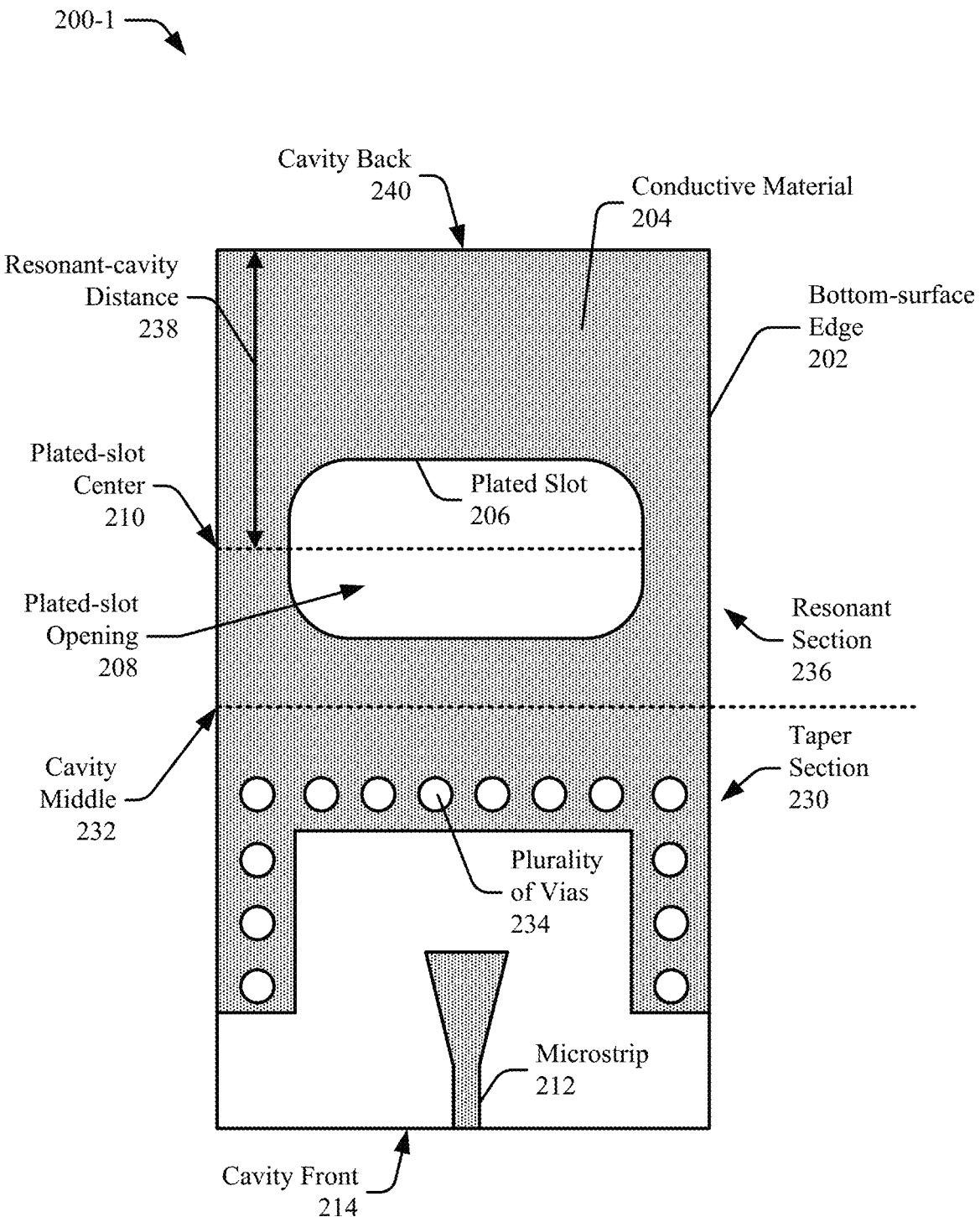
Figure 2:
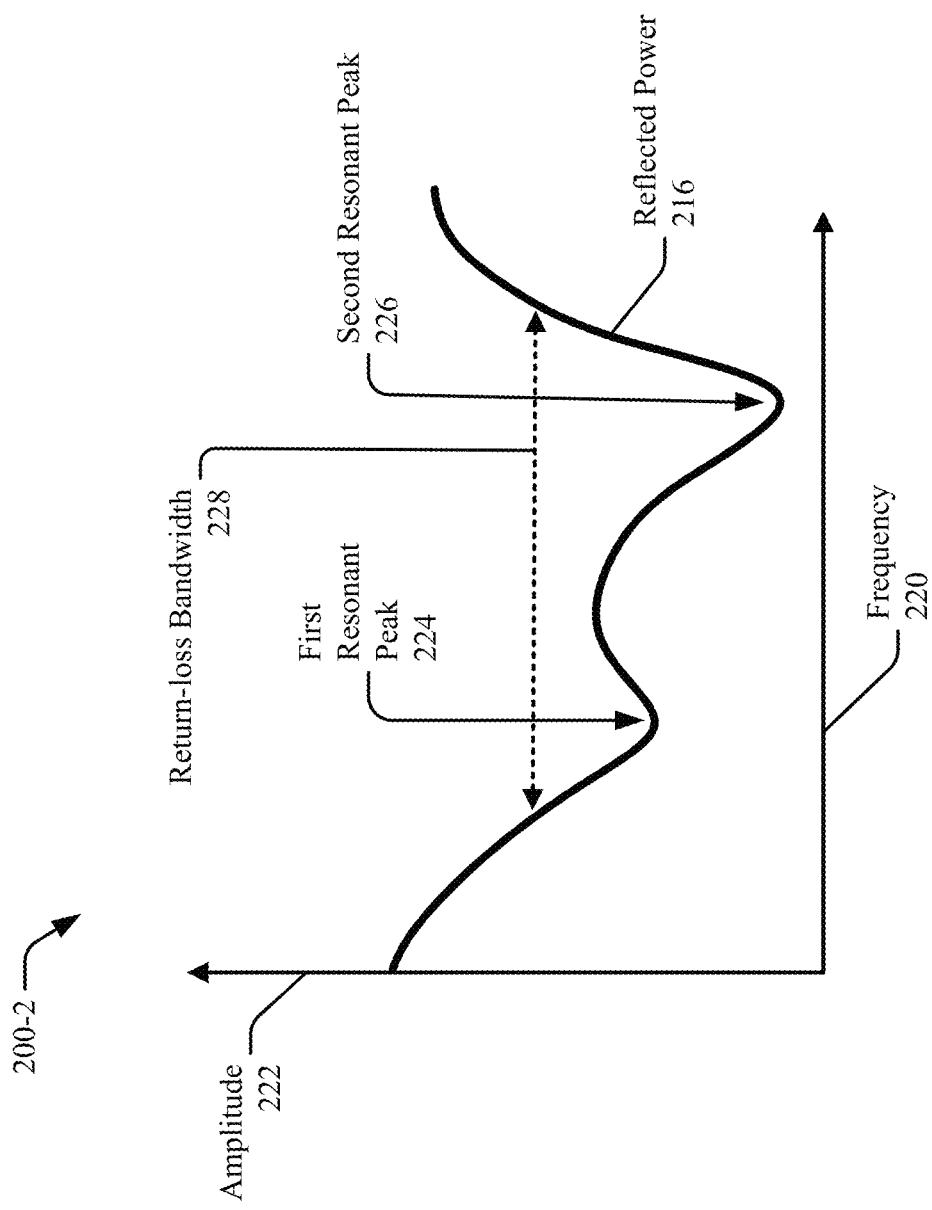
Figure 2:
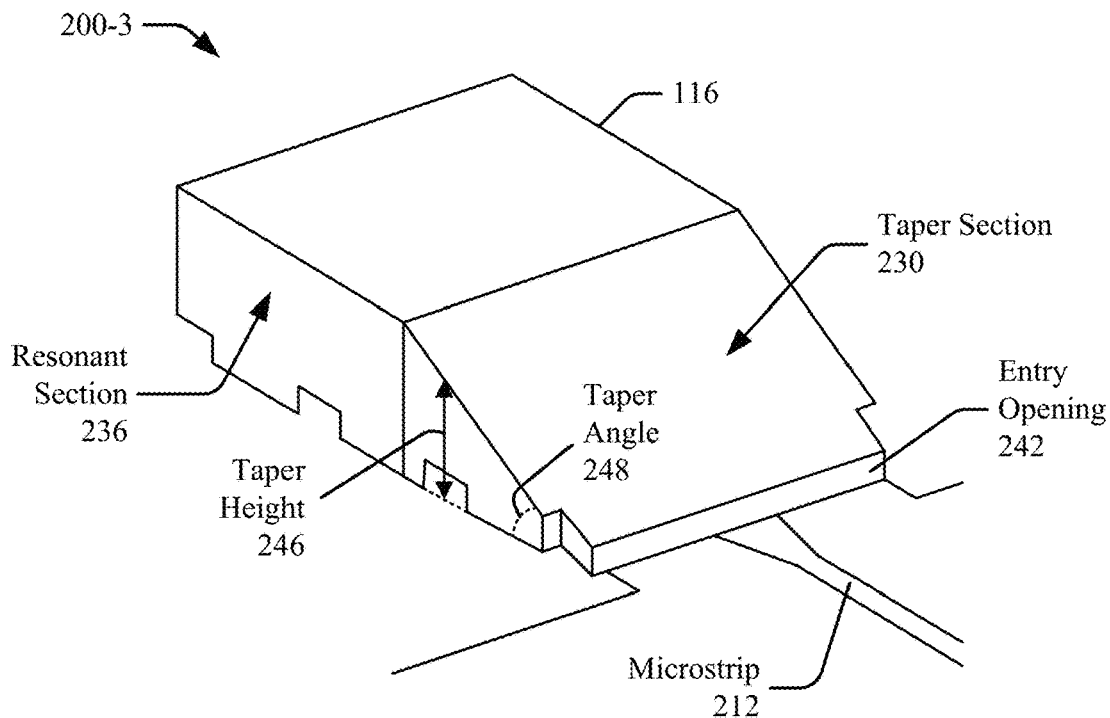

The waveguide cavity 116 is configured to perform impedance matching of the EM energy while guiding the EM energy from the first surface 108 to the second surface 110 via a plated slot as further described in FIG. 2-1.

Example Waveguide Assembly

FIG. 2-1 illustrates a bottom surface of the waveguide cavity 116 that is configured to be open and mounted directly to the first surface 108 of the PCB 106. The bottom surface can be mounted using solder at a bottom-surface edge 202 to electrically and mechanically connect the waveguide cavity 116 to a conductive material 204 coated on the first surface 108. The conductive material 204 may comprise a metal material including tin-lead, silver, gold, copper, and so forth to enable the transport of electrical signals.

The waveguide cavity 116 is positioned over a plated slot 206 that is configured to channel the EM energy from the planar dimension 112 to the vertical dimension 114. The plated slot 206 includes a plated-slot opening 208 that comprises a hole in each layer of the PCB 106, concentrically aligned along a plated-slot center 210. The plated-slot opening 208 illustrated in environment 200-1 resembles a rectangle with rounded corners. However, the plated-slot opening 208 may comprise various shapes, including a circle, an oval, a rectangle, a square, and so forth. The plated-slot opening 208 may also comprise various sizes (e.g., diameters), which all support techniques of the waveguide assembly 102 described herein.

The plated-slot opening 208 is surrounded by the conductive material 204 to enable electrical connections between the first surface 108 and the second surface 110. For example, the EM energy may travel to the waveguide cavity 116 along the planar dimension 112 via a microstrip line 212 that comprises the conductive material 204. The microstrip line 212 is aligned orthogonal to and centered about a cavity front 214. The waveguide cavity 116 can then channel the EM energy towards the plated slot 206, which is configured to transport the EM energy from the first surface 108 to the second surface 110 (e.g., containing the antenna) along the vertical dimension 114 via the plated-slot opening 208.

The waveguide cavity 116 is further configured to perform impedance matching (e.g., matching an electrical resistance in series with a reactance) of the EM energy. When an impedance of a load (e.g., the antenna) and a source (e.g., a power source) are mismatched, there exists a discontinuity that may reflect waves of the EM energy, reducing transmission of the EM energy to the load. The discontinuity may cause attenuation, distortion, standing waves, or ringing of the EM energy.

To perform impedance matching, the waveguide cavity 116 may modify a source impedance (e.g., an internal or output impedance) to match the impedance of the load, including the antenna. By impedance matching within the waveguide cavity 116, the waveguide assembly 102 may maximize power transferred to the antenna and minimize the EM energy reflected by the discontinuity. Maximizing power to the antenna may increase the efficiency of a radar system that is configured to determine the proximity, the angle, or the velocity of the at least one object. For example, the automobile 104 may use such a radar system to better avoid collisions with the at least one object and protect passengers within the automobile 104.

FIG. 2-2 graphically illustrates a reflected power 216 in terms of a frequency 220. The reflected power 216 represents power that is reflected from the load and sent back to the power source. For example, if the reflected power 216 has an amplitude 222 of zero decibels (dB), then all of the power is reflected by the load, and none of the EM energy is radiated (e.g., by the antenna).

To increase power radiated by the load, the waveguide cavity 116 is designed to increase the amplitude 222 of the reflected power 216 by generating a first resonant peak 224 and a second resonant peak 226 by fabricating a specific geometry and size of the waveguide cavity 116. The first resonant peak 224 and the second resonant peak 226 increase a return-loss bandwidth 228 of the reflected power 216. The return-loss bandwidth comprises a range of the frequencies 220 at a specified amplitude 222 in which the load radiates the EM energy. The frequency 220 may include millimeter waves (e.g., radio waves) within a range of 30-300 gigahertz (GHz) and specifically a range of 65-90 GHz. The frequency 220 may also include a microwave range of 3-30 GHz.

The first resonant peak 224 is generated in a taper section 230 that is configured to taper a height of the waveguide cavity 116, increasing the height from the cavity front 214 to a cavity middle 232. An initial impedance is generated at the cavity front 214, and impedance matched to the load within the taper section 230. The taper section 230 comprises the microstrip line 212 and a plurality of vias 234.

The plurality of vias 234 comprises at least one vias opening in the PCB 106 that is configured to enable electrical connections between layers of the PCB 106. However, the plurality of vias 234 may comprise several vias openings as illustrated in environment 200-1. The vias opening can include thru vias that are configured to electrically connect all layers of the PCB 106. The thru vias can be located on both the first surface 108 of the PCB 106 and the second surface 110. The vias opening can also include blind vias configured to electrically connect at least one, but not all, of the layers of the PCB 106. The blind vias can be located on either the first surface 108 of the PCB 106 or the second surface 110 but not both. The vias opening may additionally include one or more buried vias or thermal vias.

The plurality of vias 234 is configured to create a boundary condition that enables the excitation of a mode of the EM energy. The mode may include a dominant mode (e.g., TE10) with a lowest cut-off frequency. However, the waveguide cavity 116 may accommodate other modes of the EM energy (e.g., TE20, TE30, and so forth).

The second resonant peak 226 is generated in a resonant section 236. The resonant section 236 is connected to the taper section 230 at the cavity middle 232 and comprises a rectangular shape. A resonant-cavity distance 238 is designed to enable the generation of the second resonant peak 226 at a specific frequency 220. The resonant-cavity distance 238 is a distance between the plated-slot center 210 and a cavity back 240. The resonant-cavity distance 238 may be designed, for example, to a length of three-quarters of a wavelength of the EM energy. However, other lengths of the resonant-cavity distance 238 can be used to enable impedance matching. The resonant section 236 is further described in FIG. 2-2.

Figure 3:
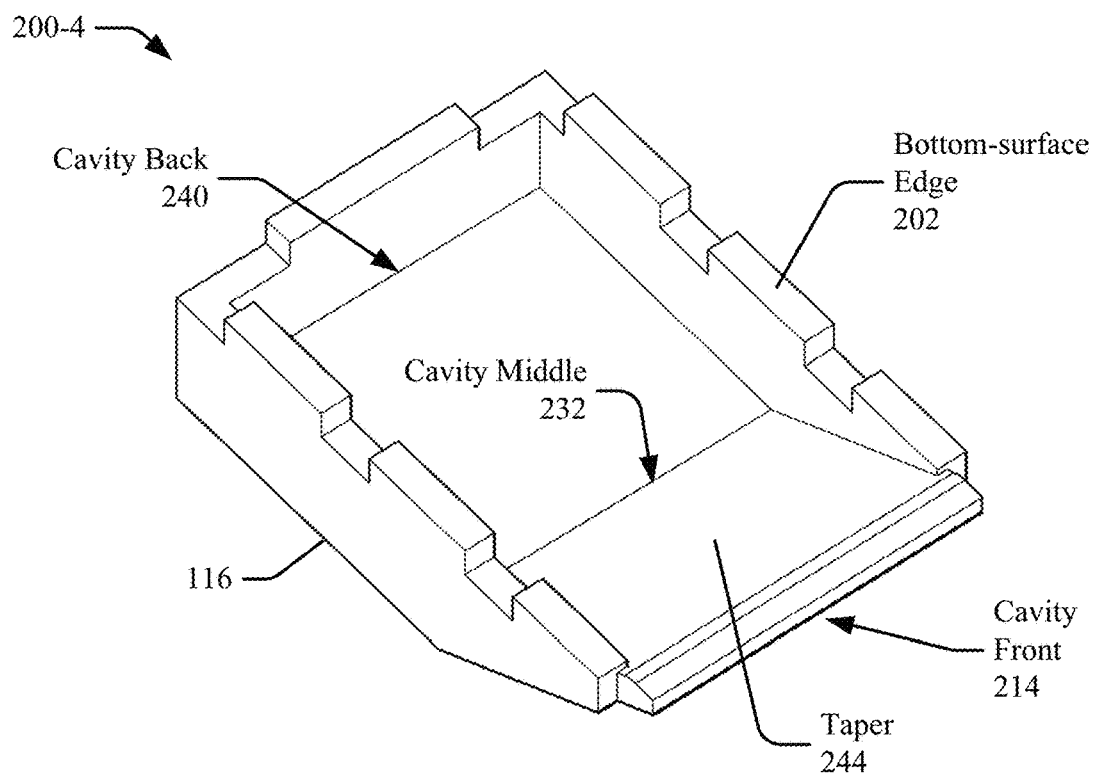
Figure 3:
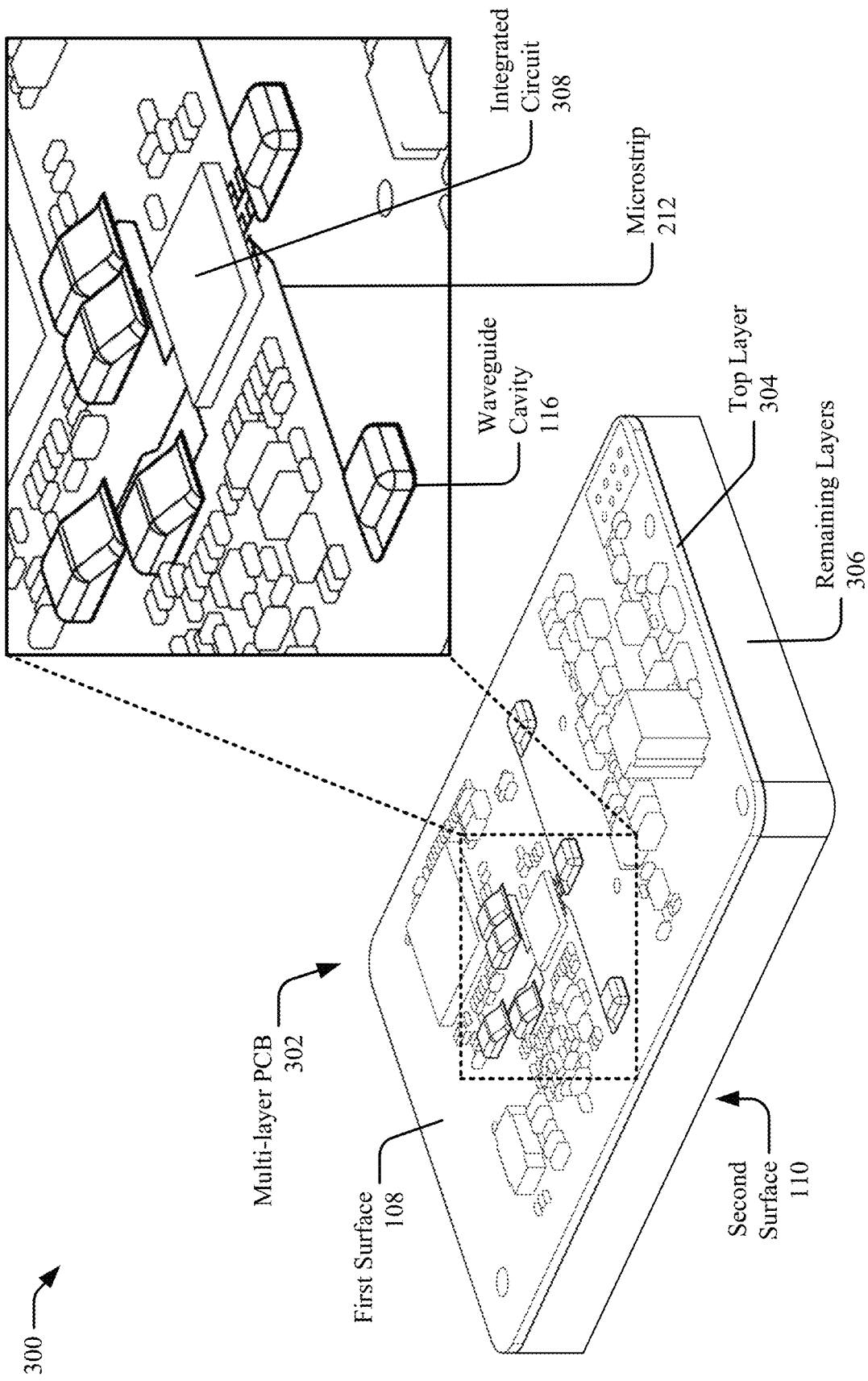

FIG. 2-3 illustrates the waveguide cavity 116 from two distinct perspectives, a top view 200-3 and a bottom view 200-4. Both views 200-3 and 200-4 illustrate that the taper section 230 is connected to the resonant section 236 at the cavity middle 232. Furthermore, the taper section 230 comprises an entry opening 242 located at the cavity front 214. The taper section 230 further comprises a taper 244 associated with a taper height 246. The taper height 246 is configured to increase from the entry opening 242 to the resonant cavity 236 at a taper angle 248.

The taper angle 248 is chosen to enable a gradual increase in the taper height 246 to perform impedance matching of the EM energy. The gradual increase enables a smooth transmission response (e.g., between the load and the source), reduces loss of the EM energy, and increases the return-loss bandwidth 228 of the reflected power 216.

The entry opening 242 is configured to enable the EM energy to enter the waveguide cavity 116 via the microstrip line 212. The entry opening 242 comprises a thin rectangular opening of the waveguide cavity 116. The entry opening 242 may also include other shapes including a slit, an ellipse, and so forth. A height of the entry opening 242 (e.g., a distance from the bottom surface to a top of the entry opening 242) is configured to change the amplitude 222 of the first resonant peak 224 and the return-loss bandwidth 228. The initial impedance is generated by the entry opening 242 at the cavity front 214. Furthermore, the excitation of the mode of the EM energy is generated by the boundary condition created by the plurality of vias 234 and the entry opening 242.

The waveguide cavity 116 may comprise a metal material including a metal chemical element (e.g., copper, nickel, titanium, iron), an alloy (e.g., steel, stainless steel, cast iron), or a molecular compound (e.g., polymeric sulfur nitride). The waveguide cavity 116 may also include a non-metal material (e.g., dielectric, non-metal elements, non-metal compounds) with a coating of the metal material that at least partially covers the non-metal material. The waveguide cavity 116 is further described in relation to the waveguide assembly 102 in FIG. 3.

FIG. 3 illustrates an example waveguide assembly 102 in which the PCB 106 comprises more than one layer. Environment 300 illustrates a multi-layer PCB 302 that includes a top layer 304 and remaining layers 306. The remaining layers 306 comprise at least one layer. If the remaining layers 306 comprise more than one layer, then each layer is aligned in parallel with and at least partially in contact with each other. The top layer 304 is aligned in parallel with and at least partially in contact with the remaining layers 306.

The multi-layer PCB 302 may include a hybrid PCB stack-up in which the top layer 304 comprises a material that is distinct from the remaining layers 306. The hybrid PCB stack-up may include one or more ground planes (e.g., metal layer connected to a ground point), power planes, or signal layers. The top layer 304 may include a dielectric material (e.g., porcelain, glass, plastic, mica, metal oxides, polymers). For example, the top layer 304 may comprise an I-Tera® MT40 laminate or a Rogers RO3003™ or RO4835™ laminate. The remaining layers 306 may also include the dielectric materials but must use at least one material distinct from the top layer 304. While the top layer 304 may include a more expensive dielectric material, the remaining layers 306 may include less expensive dielectric materials to reduce a cost of the PCB fabrication. For example, the remaining layers 306 may include the flame retardant 4 (FR-4) composite materials (e.g., glass-reinforced epoxy laminates). If the remaining layers 306 comprise more than one layer, then each layer may comprise a distinct material, a same material, or a combination of distinct and same material layers.

The waveguide assembly 102 may further include an integrated circuit (IC) 308 that is electrically connected to the waveguide cavity 116 via the microstrip line 212 and can use the PCB components (e.g., transistors, diodes, capacitors, resistors) to enable operations of the waveguide assembly 102. The IC 308 can be mounted on the first surface 108 of the PCB 106 the multi-layer PCB 302, or the hybrid PCB stack-up to avoid mounting the IC 308 on a same side as a load. For example, in environment 300, the IC 308 is mounted on the first surface 108 while the antenna is mounted on the second surface 110. Because the IC 308 is not mounted on the same side as the antenna, the IC 308 does not need to be shielded.

The IC 308 may include a monolithic microwave integrated circuit (MMIC) configured to operate at frequencies 220 in a microwave range (e.g., 300 megahertz to 300 GHz). The MMIC may be heat sunk into the first surface 108 to distribute thermal energy generated, at least in part, by the MMIC. A process for creating the waveguide assembly 102 is further described in FIG. 4.

Example Methods

FIG. 4 illustrates an example technique for creating and performing operations of the waveguide cavity 116. A process 400 is shown as sets of operations (or acts) performed and is not necessarily limited to the order or combinations in which the operations are shown herein. Further, any of one or more operations may be repeated, combined, reorganized, or linked to provide a wide array of additional and/or alternative processes. In portions of the following discussion, reference may be made to environments and entities detailed in FIGS. 1-3, reference to which is made for example only.

At 402, a waveguide cavity is formed. For example, the waveguide cavity 116 illustrated in FIG. 2-2 may be formed using a sheet-metal drawing process, which includes using tensile forces to stretch the metal material to a desired shape and thickness. The waveguide cavity 116 may also be formed using a sheet-metal-stamping process, which includes applying pressure to the metal material by using a stamping press to form the desired shape and thickness. For complex shapes, the sheet-metal-stamping process may cost less than the sheet-metal-drawing process. The waveguide cavity 116 may additionally be formed using a cast heatsink further described in FIG. 5.

All three processes of forming the waveguide cavity 116 must produce an accurate shape on an inside of the waveguide cavity 116 to enable operations of the waveguide assembly 102. For example, the taper angle 248, the taper height 246, and the resonant-cavity distance 238 must be accurate on the inside of the waveguide cavity 116, regardless of process. An outside shape of the waveguide cavity 116 can appear distinct between processes without impacting the operations of the waveguide assembly 102.

At 404, the waveguide cavity is mounted directly on the first surface of the PCB and positioned over the plated slot. For example, the waveguide cavity 116 illustrated in FIG. 2-2 is mounted directly on the first surface 108 of the PCB 106, the multi-layer PCB 302, or the hybrid PCB stack-up. The waveguide cavity 116 is connected to the first surface 108 using the conductive material 204. The waveguide cavity 116 is positioned over the plated slot 206 with respect to the resonant-cavity distance 238 to enable the generation of the first resonant peak 224 and the second resonant peak 226.

At 406, the waveguide cavity performs impedance matching of the EM energy while guiding the EM energy from the first surface to the second surface of the PCB via the plated slot. For example, the waveguide cavity 116 illustrated in FIGS. 2-1 and 2-2 performs impedance matching of the EM energy in the taper section 230 by gradually increasing the taper height 246 from the cavity front 214 to the cavity middle 232 by the taper angle 248. The waveguide cavity 116 also guides the EM energy from the first surface 108 to the second surface 110 via the plated slot 206. Example waveguide cavities 116 are further described in FIG. 5.

Figure 5:
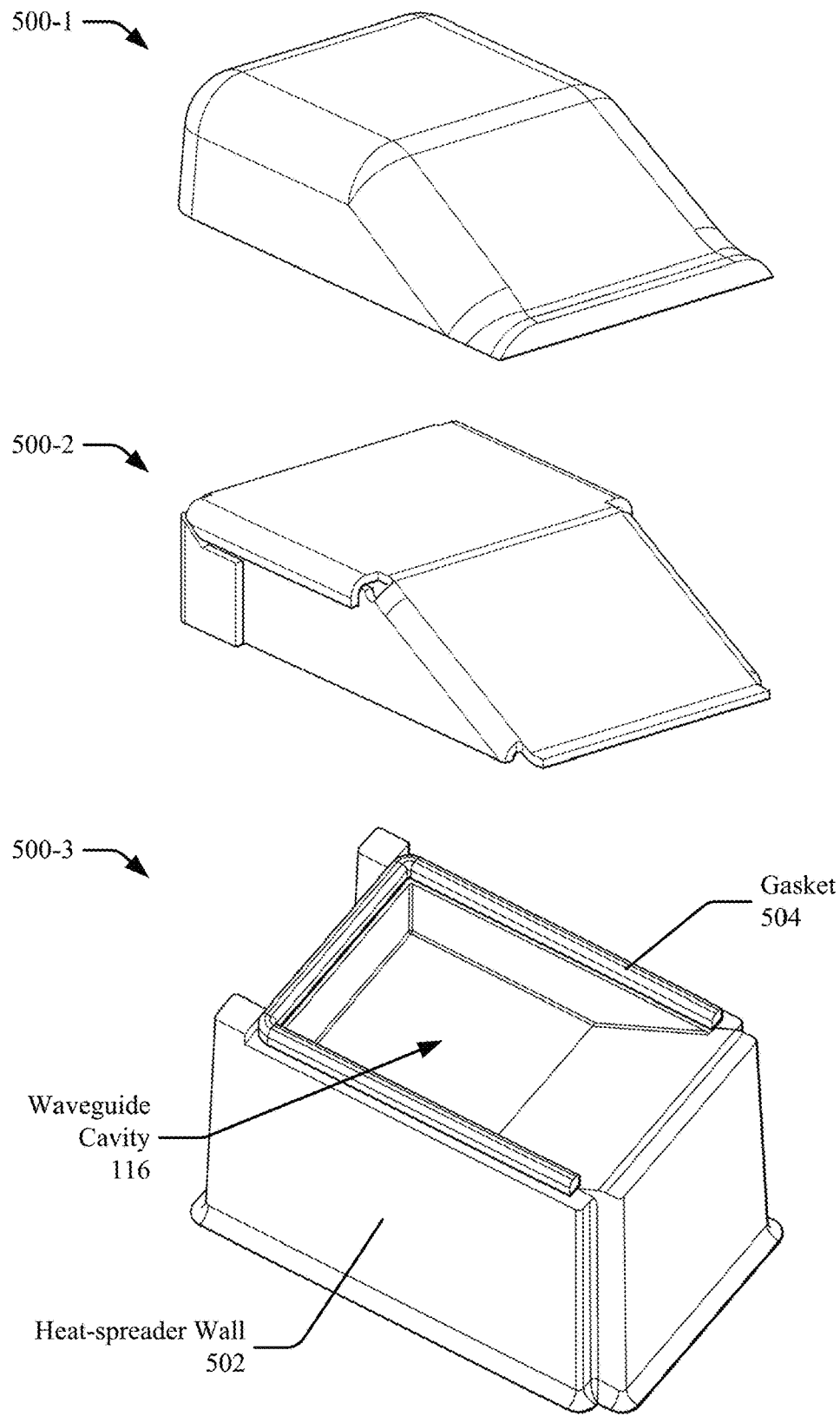
FIG. 5 illustrates three distinct types of waveguide cavities that perform similar operations.

FIG. 5 illustrates three types of waveguide cavities 500-1, 500-2, and 500-3 that may be formed using process 400. While only three variations are illustrated, the waveguide cavity 116 may be formed into other shapes not shown and using other processes not illustrated in FIG. 4.

A drawn-waveguide cavity 500-1 is formed using the sheet-metal-drawing process, and a stamped-waveguide cavity 500-2 is formed using the sheet-metal-stamping process. Both the drawn-waveguide cavity 500-1 and the stamped-waveguide cavity 500-2 have a same shape on the inside of the waveguide cavity 116, but the outside shape appears distinct.

A cast-waveguide cavity 500-3 is formed by positioning the waveguide cavity 116 inside a cast heatsink. The cast heatsink is surrounded by a heat-spreader wall 502 that is configured to distribute thermal energy to cool the cast-waveguide cavity 500-3. The cast-waveguide cavity 500-3 is located within at least one layer of the PCB 106 and does not require soldering. For the cast-waveguide cavity 500-3, the waveguide cavity 116 may further comprise an electrically conductive plastic material or a non-conductive plastic material plated in metal.

The cast-waveguide cavity 500-3 includes a gasket 504 positioned around the bottom-surface edge 202 and in contact with the first surface 108 of the PCB 106. The gasket 504 comprises a conductive material that is configured to compress under pressure (e.g., nickel and graphite filled silicone or fluorosilicone, silicone foam, closed-cell silicone or fluorosilicone sponge, wire mesh, and so forth) to provide electrical and mechanical contact with the first surface 108. The gasket 504 enables electrical connections and transport of the EM energy within the waveguide assembly 102. Preliminary results of the drawn-waveguide cavity 500-1 and the stamped-waveguide cavity 500-2 are further described in FIG. 6.

Preliminary Results

Preliminary results are illustrated in FIG. 6 for both an example drawn-waveguide cavity 500-1 plotted in 600 and an example stamped-waveguide cavity 500-2 plotted in 602. Both example waveguide cavities 116 were fabricated with 0.3 millimeter (mm) thick metal walls. An inside dimension of the resonant section 236 was fabricated with dimensions of 2.65 mm length, 3.1 mm width, and 0.8 mm height, where the length is measured along the resonant-cavity distance 238 of the planar dimension 112, the width is measured along the cavity back 240 of the planar dimension 112, and the height is measured along the vertical dimension 114. The taper 244 was fabricated with dimensions of 2.8 mm length, 3.1 mm width, and 0.8 mm taper height 246 measured at the cavity middle 232. A resultant taper angle 248 was fabricated at 16.6°. The resonant-cavity distance 238 was fabricated at three-quarters the wavelength of the EM energy, and the waveguide cavity 116 was mounted onto the first surface 108 with a cured solder thickness of 2 mils (e.g., two thousandths of an inch). The waveguide cavity 116 may be fabricated with other dimensions, including different lengths, widths, and heights.

Preliminary results indicate that both the drawn-waveguide cavity 500-1 and the stamped-waveguide cavity 500-2 perform better than the plated slot 206 in an absence of the waveguide cavity 116. The plated slot 206 in the absence of the waveguide cavity 116 features a transmission loss of 2 dB, whereas the drawn-waveguide cavity 500-1, for example, features a transmission loss of 0.5 dB. The drawn-waveguide cavity 500-1 performs better than the stamped-waveguide cavity 500-2 (e.g., less transmission loss, increased return-loss bandwidth) and dissipates less of the EM energy through leakage at the bottom-surface edge 202, thereby increasing efficiency.

Plots of 600 and 602 illustrate the performance of the example drawn-waveguide cavity 500-1 and the example stamped-waveguide cavity 500-2, respectively, in terms of scattering (S) parameters. The S-parameters refer to an interaction between the EM energy and any discontinuity of the waveguide assembly 102. For example, the waves of the EM energy may encounter an impedance within the waveguide assembly 102 that is distinct from the source impedance or a load impedance of the waves. Three distinct S-parameters are plotted, S11 604, S22 606, and S12 608. In this example, S11 604 refers to the reflected power 216 of port 1, where port 1 represents the power source. S22 606 refers to the reflected power 216 of port 2, where port 2 represents the load (e.g., the antenna). S12 608 refers to a transmission power of port 1 to port 2.

The transmission power S12 608 shown in plots 600 and 602 indicates a smooth transmission of the EM energy across 65-90 GHz with approximately 0.5 dB of transmission loss. The reflected powers 216 of S11 604 and S22 606 of plot 600 indicate the first resonant peak 224 is located at 72 GHz, and the second resonant peak 226 is located at 79 GHz with the return-loss bandwidth 228 of 12 GHz for −15 dB and 17 GHz for −10 dB. This plot indicates that the waveguide assembly 102 is most efficient at the frequencies of 72 GHz and 79 GHz but also performs well within a frequency band of 17 GHz centered approximately about 75 GHz. Furthermore, the first resonant peak 224 and the second resonant peak 226 of S11 604 and S22 606 of plot 600 are overlapped in frequency 220. Plot 602 indicates that the example stamped-waveguide cavity 500-2 is not as efficient as the example drawn-waveguide cavity 500-1, but still performs better than the plated slot 206 in the absence of the waveguide cavity 116. Alignment error results of the example drawn-waveguide cavity 500-1 are further described in FIGS. 7-1, 7-2, and 7-3.

Figures 1, 7:
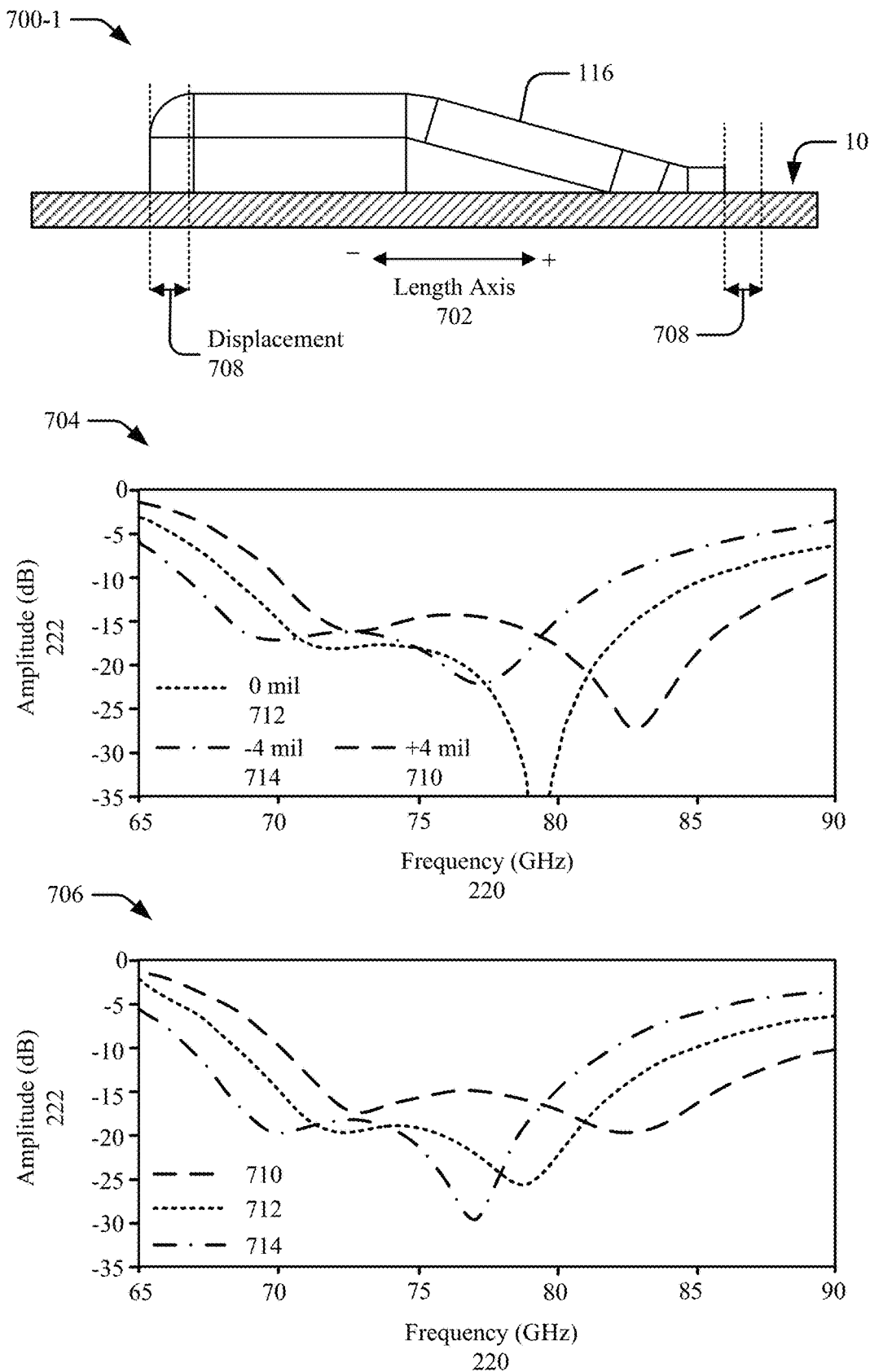
Figures 2, 7:
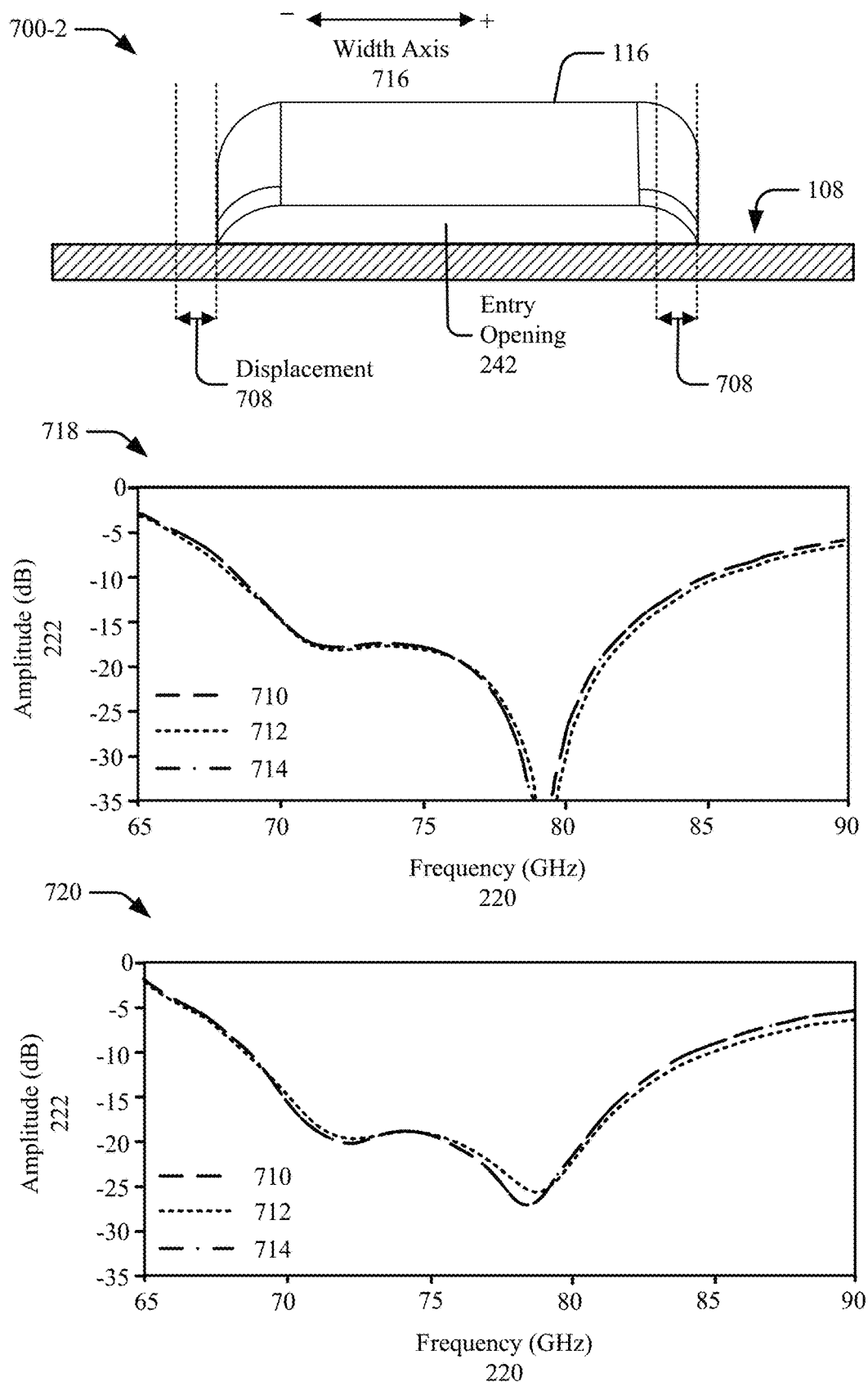
Figures 3, 7:
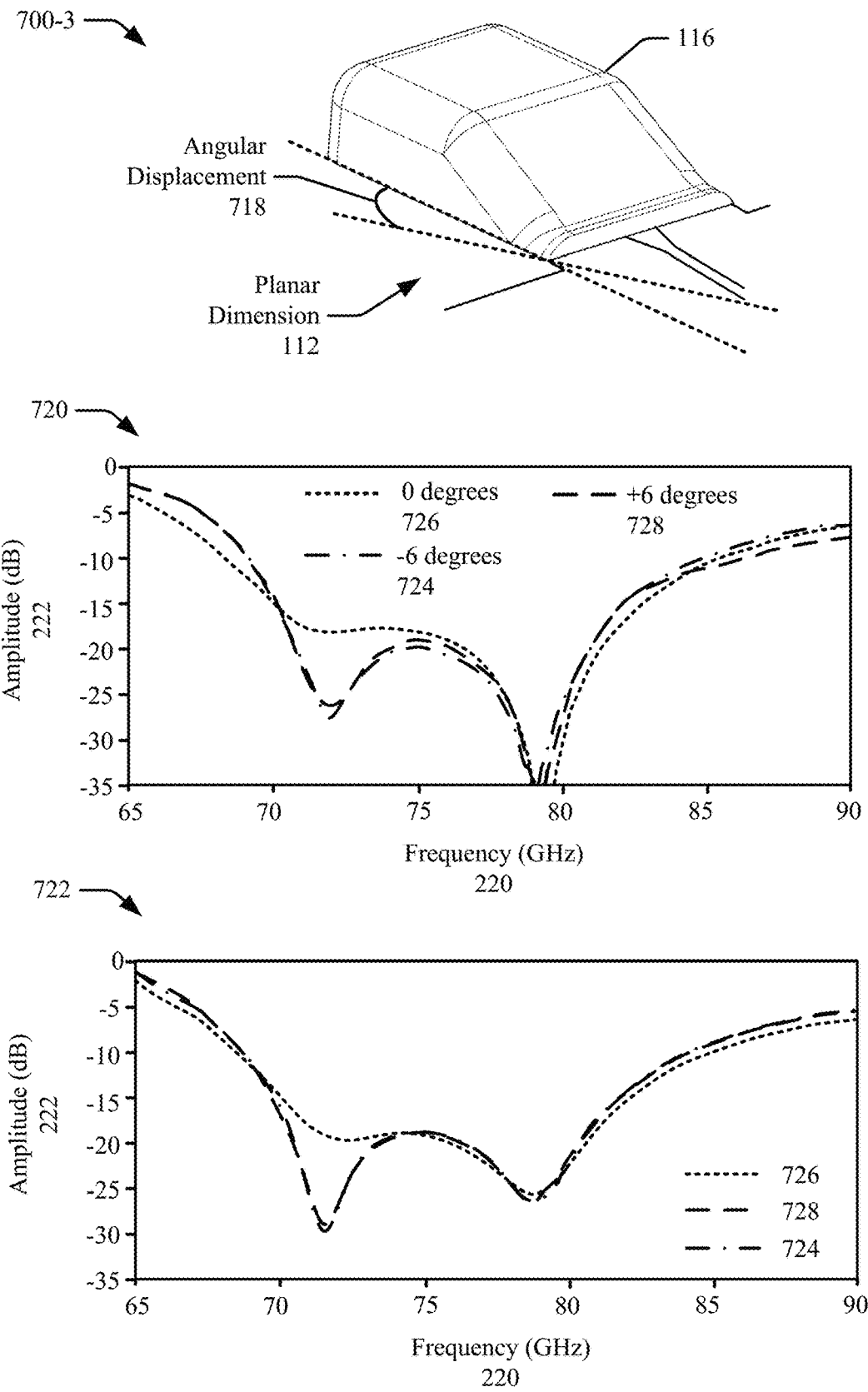

FIG. 7-1 illustrates how a first alignment error 700-1 of the waveguide cavity 116 along a length axis 702 affects the reflected power 216 of S11 604 and S22 606, shown in plots 704 and 706, respectively. The length axis 702 is aligned with the resonant-cavity distance 238 of the planar dimension 112. When the waveguide cavity 116 is mounted directly to the first surface 108, there can be a first alignment error 700-1 comprising a displacement 708 along the length axis 702. The displacement 708 is illustrated in 700-1 for +4 mil 710. Though not shown in 700-1, the displacement 708 can include 0 mil 712, −4 mil 714, and so forth. Plots 704 and 706 indicate that the displacement 708 of +4 mil 710 and −4 mil 714 along the length axis 702 results in a change in the reflected power 216, both in amplitude 222 and frequency 220 of S11 604 and S22 606. However, the example drawn-waveguide cavity 500-1 with the first alignment error 700-1 still performs better than the plated slot 206 in the absence of the waveguide cavity 116.

FIG. 7-2 illustrates how a second alignment error 700-2 of the waveguide cavity 116 along a width axis 716 affects the reflected power 216 of S11 604 and S22 606, shown in plots 718 and 720, respectively. The width axis 716 is aligned with the entry opening 242 of the planar dimension 112. When the waveguide cavity 116 is mounted directly to the first surface 108, there can be a second alignment error 700-2 comprising the displacement 708 along the width axis 716. Plots 718 and 720 indicate that the displacement 708 of +4 mil 710 and −4 mil 714 along the width axis 716 results in a negligible change in the reflected power 216, both in amplitude 222 and frequency 220 of S11 604 and S22 606.

FIG. 7-3 illustrates how a third alignment error 700-3 of the waveguide cavity 116, resulting in an angular displacement 718 within the planar dimension 112, affects the reflected power 216 of S11 604 and S22 606, shown in plots 720 and 722, respectively. The angular displacement 718 is illustrated in 700-3 for −6 degrees 724. Though not shown in 700-3, the angular displacement 718 can include 0 degrees 726, +6 degrees 728, and so forth. Plots 720 and 722 indicate that the angular displacement 718 of +6 degrees 728 and −6 degrees 724 along the planar dimension 112 results in a change in the reflected power 216, both in amplitude 222 and frequency 220 of S11 604 and S22 606. However, the example drawn-waveguide cavity 500-1 with the third alignment error 700-3 still performs better than the plated slot 206 in the absence of the waveguide cavity 116.

CONCLUSION

Although apparatuses including a surface-mount waveguide for vertical transitions of a printed circuit board have been described in language specific to features, it is to be understood that the subject of the appended claims is not necessarily limited to the specific features described. Rather, the specific features are disclosed as example implementations of a waveguide assembly that includes a surface-mount waveguide for vertical transitions of a printed circuit board.

Some Examples are described below.

Example 1

A waveguide assembly comprising: a printed circuit board (PCB) comprising: at least one PCB layer that includes a first surface and a second surface positioned opposite and in parallel with the first surface; a plated slot configured to channel an electromagnetic (EM) energy from a planar dimension in parallel with the first surface to a vertical dimension that is orthogonal to the planar dimension, the plated slot comprising an opening surrounded by a conductive material to enable electrical connections between the first surface and the second surface, the opening configured to transfer the EM energy between the first surface and the second surface; and a waveguide cavity mounted directly on the first surface and positioned over the plated slot, the waveguide cavity configured to perform impedance matching of the EM energy while guiding the EM energy from the first surface to the second surface via the plated slot.

Example 2

The waveguide assembly of example 1, further comprising at least one antenna mounted on the second surface of the PCB, wherein the waveguide assembly is configured to: direct the EM energy from the second surface of the PCB to the at least one antenna; and transmit the EM energy using the at least one antenna.

Example 3

The waveguide assembly example 1, wherein: the waveguide cavity further comprises a drawn-waveguide cavity; the drawn-waveguide cavity is formed using a sheet metal drawing process; and the sheet metal drawing process comprises pulling a metal material to form the drawn-waveguide cavity.

Example 4

The waveguide assembly of example 1, wherein: the waveguide cavity further comprises a stamped-waveguide cavity; the stamped-waveguide cavity is formed using a sheet metal stamping process; and the sheet metal stamping process comprises pressing a metal material with a stamping press to form the stamped-waveguide cavity.

Example 5

The waveguide assembly example 1, wherein the waveguide assembly is configured to: enable operations of a radar system wherein the radar system is configured to determine a proximity, an angle, or a velocity of at least one object; and mount to an automobile.

Example 6

The waveguide assembly of example 1, wherein the waveguide cavity is hollow and comprises: a bottom surface configured to be open, the bottom surface mounted directly on the first surface of the PCB; a taper section configured to taper a height of the waveguide cavity, the height of the waveguide cavity increasing from a cavity front to a cavity middle, the height of the waveguide cavity is tapered to enable impedance matching of the EM energy; and a resonant section connected to the taper section at the cavity middle, the resonant section is rectangular in shape.

Example 7

The waveguide assembly of example 6, wherein the waveguide cavity further comprises an entry opening positioned at the cavity front, the entry opening configured to: enable the EM energy to enter the waveguide cavity via a microstrip line, the microstrip line aligned orthogonal to and centered about the entry opening, the microstrip line comprising a conductive material and configured to enable electrical connections; excite a mode of the EM energy; and generate a first resonant peak configured to increase a return-loss bandwidth, wherein an increase in the return-loss bandwidth is correlated with an increase in power supplied to at least one antenna.

Example 8

The waveguide cavity of example 7, wherein a height of the entry opening is configured to: change an amplitude of the first resonant peak; and change the return-loss bandwidth.

Example 9

The waveguide assembly of example 7, wherein: a resonant-cavity distance is defined from a center of the plated slot to a back of the waveguide cavity; the resonant-cavity distance is configured to generate a second resonant peak; and the second resonant peak is configured to increase the return-loss bandwidth.

Example 10

The waveguide assembly of example 7, wherein: the PCB further comprises an integrated circuit (IC) mounted on the first surface of the PCB; the IC is electrically connected to the waveguide cavity via the microstrip line; and the microstrip line is further configured to enable transport of the EM energy between the waveguide cavity and the IC.

Example 11

The waveguide assembly of example 10, wherein: the IC is a monolithic microwave integrated circuit (MMIC) configured to operate at frequencies in a microwave range; and the MMIC is heat sunk into the first surface of the PCB, configured to distribute thermal energy that is generated at least in part by the MMIC.

Example 12

The waveguide assembly of example 6, wherein the PCB further comprises: a top layer; and remaining layers comprising at least one layer, the remaining layers aligned in parallel and at least partially in contact, the top layer aligned in parallel with and at least partially in contact with the remaining layers.

Example 13

The waveguide assembly of example 12, wherein the PCB further comprises at least one vias, the at least one vias comprising: a vias opening in the at least one PCB layer, the vias opening lined with a conductive material, the vias opening configured to electrically connect layers of the PCB; and at least one of the following: a thru vias configured to electrically connect all of the layers of the PCB, the vias opening located on both the first surface of the PCB and the second surface of the PCB; and a blind vias configured to electrically connect at least one of the layers of the PCB but not all of the layers of the PCB, the vias opening located on either the first surface of the PCB or the second surface of the PCB but not both.

Example 14

The waveguide assembly of example 13, wherein: the taper section comprises a plurality of vias; the plurality of vias is positioned on the bottom surface; the plurality of vias comprises at least one of the following: the thru vias; or the blind vias; and the plurality of vias is configured to enable: excitation of a mode of the EM energy; and generation of a first resonant peak.

Example 15

The waveguide assembly of example 12, wherein: the PCB further comprises a hybrid PCB stack-up comprising the top layer and the remaining layers; the top layer comprises a first material distinct from a second material of the remaining layers; and the first material comprises a dielectric material.

Example 16

The waveguide assembly of example 15, wherein the second material includes one or more of the following: porcelain; mica; glass; plastic; metal oxides; and polymers.

Example 17

The waveguide assembly of example 6, wherein the waveguide cavity further comprises a metal material configured to enable transport of the EM energy from the cavity front to the plated slot.

Example 18

The waveguide assembly of example 6, wherein the PCB further comprises a cast-waveguide cavity located within the at least one PCB layer, the cast-waveguide cavity comprises: a cast heatsink configured to distribute thermal energy via a heat-spreader wall that surrounds the cast heatsink; the waveguide cavity further configured to be positioned within the cast heatsink; and a gasket positioned around the bottom surface and in contact with the first surface of the PCB, the gasket configured to enable: compression of the gasket; and electrical connections including transport of the EM energy.

Example 19

The waveguide assembly of example 18, wherein the waveguide cavity comprises an electrically conductive plastic material configured to enable electrical connections.

Example 20

The waveguide assembly of example 18, wherein the waveguide cavity comprises a plated plastic material configured to enable electrical connections, the plated plastic material comprising a plastic material coated in metal.

What is claimed is:

1. A waveguide assembly comprising:
a printed circuit board (PCB) comprising:
at least one PCB layer that includes a first surface and a second surface positioned opposite and in parallel with the first surface;
a plated slot configured to channel an electromagnetic (EM) energy from a planar dimension in parallel with the first surface to a vertical dimension that is orthogonal to the planar dimension, the plated slot comprising an opening surrounded by a conductive material to enable electrical connections between the first surface and the second surface, the opening configured to transfer the EM energy between the first surface and the second surface; and
a waveguide cavity mounted directly on the first surface and positioned over the plated slot, the waveguide cavity being hollow and configured to perform impedance matching of the EM energy while guiding the EM energy from the first surface to the second surface via the plated slot, the waveguide cavity comprising:
a bottom surface configured to be open, the bottom surface mounted directly on the first surface of the PCB;
a taper section configured to taper a height of the waveguide cavity, the height of the waveguide cavity gradually increasing at a taper angle from a cavity front to a cavity middle, the height of the waveguide cavity being tapered to enable impedance matching of the EM energy; and
a resonant section connected to the taper section at the cavity middle, the resonant section being rectangular in shape.

2. The waveguide assembly of claim 1, further comprising at least one antenna mounted on the second surface of the PCB, wherein the waveguide assembly is configured to:
direct the EM energy from the first surface of the PCB to the at least one antenna; and
transmit the EM energy using the at least one antenna.

3. The waveguide assembly claim 1, wherein:
the waveguide cavity further comprises a drawn-waveguide cavity;
the drawn-waveguide cavity is formed using a sheet metal drawing process; and
the sheet metal drawing process comprises pulling a metal material to form the drawn-waveguide cavity.

4. The waveguide assembly of claim 1, wherein:
the waveguide cavity further comprises a stamped-waveguide cavity;
the stamped-waveguide cavity is formed using a sheet metal stamping process; and
the sheet metal stamping process comprises pressing a metal material with a stamping press to form the stamped-waveguide cavity.

5. The waveguide assembly claim 1, wherein the waveguide assembly is configured to:
enable operations of a radar system wherein the radar system is configured to determine a proximity, an angle, or a velocity of at least one object; and
mount to an automobile.

6. The waveguide assembly of claim 1, wherein the waveguide cavity further comprises an entry opening positioned at the cavity front, the entry opening configured to:
enable the EM energy to enter the waveguide cavity via a microstrip line, the microstrip line aligned orthogonal to and centered about the entry opening, the microstrip line comprising a conductive material and configured to enable electrical connections;
excite a mode of the EM energy; and
generate a first resonant peak configured to increase a return-loss bandwidth, wherein an increase in the return-loss bandwidth is correlated with an increase in power supplied to at least one antenna.

7. The waveguide cavity of claim 6, wherein a height of the entry opening is configured to:
change an amplitude of the first resonant peak; and
change the return-loss bandwidth.

8. The waveguide assembly of claim 6, wherein:
a resonant-cavity distance is defined from a center of the plated slot to a back of the waveguide cavity;
the resonant-cavity distance is configured to generate a second resonant peak; and
the second resonant peak is configured to increase the return-loss bandwidth.

9. The waveguide assembly of claim 6, wherein:
the PCB further comprises an integrated circuit (IC) mounted on the first surface of the PCB;
the IC is electrically connected to the waveguide cavity via the microstrip line; and
the microstrip line is further configured to enable transport of the EM energy between the waveguide cavity and the IC.

10. The waveguide assembly of claim 9, wherein:
the IC is a monolithic microwave integrated circuit (MMIC) configured to operate at frequencies in a microwave range; and
the MMIC is heat sunk into the first surface of the PCB, configured to distribute thermal energy that is generated at least in part by the MMIC.

11. The waveguide assembly of claim 1, wherein the PCB further comprises:
a top layer; and
remaining layers comprising at least one layer, the remaining layers aligned in parallel and at least partially in contact, the top layer aligned in parallel with and at least partially in contact with the remaining layers.

12. The waveguide assembly of claim 11, wherein the PCB further comprises multiple vias, the multiple vias comprising:
a vias opening in the at least one PCB layer, the vias opening lined with a conductive material, the vias opening configured to electrically connect layers of the PCB; and
at least one of the following:
a thru via configured to electrically connect all of the layers of the PCB, the vias opening located on both the first surface of the PCB and the second surface of the PCB; and
a blind via configured to electrically connect at least one of the layers of the PCB but not all of the layers of the PCB, the vias opening located on either the first surface of the PCB or the second surface of the PCB but not both.

13. The waveguide assembly of claim 12, wherein:
the taper section comprises a plurality of vias;
the plurality of vias is positioned on the bottom surface;
the plurality of vias comprises at least one of the following:
the thru via; or
the blind vias; and
the plurality of vias is configured to enable:
excitation of a mode of the EM energy; and
generation of a first resonant peak.

14. The waveguide assembly of claim 11, wherein:
the PCB further comprises a hybrid PCB stack-up comprising the top layer and the remaining layers;
the top layer comprises a first material distinct from a second material of the remaining layers; and
the first material comprises a dielectric material.

15. The waveguide assembly of claim 14, wherein the second material includes one or more of the following:
porcelain;
mica;
glass;
plastic;
metal oxides; and
polymers.

16. The waveguide assembly of claim 1, wherein the waveguide cavity further comprises a metal material configured to enable transport of the EM energy from the cavity front to the plated slot.

17. The waveguide assembly of claim 1, wherein the PCB further comprises a cast-waveguide cavity located within the at least one PCB layer, the cast-waveguide cavity comprises:
a cast heatsink configured to distribute thermal energy via a heat-spreader wall that surrounds the cast heatsink;
the waveguide cavity further configured to be positioned within the cast heatsink; and
a gasket positioned around the bottom surface and in contact with the first surface of the PCB, the gasket configured to enable:
compression of the gasket; and
electrical connections including transport of the EM energy.

18. The waveguide assembly of claim 17, wherein the waveguide cavity comprises an electrically conductive plastic material configured to enable electrical connections.

19. The waveguide assembly of claim 17, wherein the waveguide cavity comprises a plated plastic material configured to enable electrical connections, the plated plastic material comprising a plastic material coated in metal.

20. The waveguide assembly of claim 8, wherein the resonant-cavity distance is equal to three-quarters of a wavelength of the EM energy.

* * * * *